(12) United States Patent
Takahara

(10) Patent No.: US 9,588,601 B2
(45) Date of Patent: Mar. 7, 2017

(54) INFORMATION DISPLAY APPARATUS

(71) Applicant: PANASONIC CORPORATION, Osaka (JP)

(72) Inventor: Hiroshi Takahara, Osaka (JP)

(73) Assignee: JOLED INC, Tokyo (JP)

( * ) Notice: Subject to any disclaimer, the term of this patent is extended or adjusted under 35 U.S.C. 154(b) by 0 days.

(21) Appl. No.: 14/292,460

(22) Filed: May 30, 2014

(65) Prior Publication Data
US 2014/0267191 A1    Sep. 18, 2014

Related U.S. Application Data

(63) Continuation of application No. PCT/JP2012/007520, filed on Nov. 22, 2012.

(30) Foreign Application Priority Data

Feb. 8, 2012    (JP) .................. 2012-024702

(51) Int. Cl.
G06F 3/0354    (2013.01)
H01L 27/32    (2006.01)
G06F 3/03    (2006.01)

(52) U.S. Cl.
CPC ........ G06F 3/03545 (2013.01); G06F 3/0321 (2013.01); H01L 27/323 (2013.01)

(58) Field of Classification Search
None
See application file for complete search history.

(56) References Cited

U.S. PATENT DOCUMENTS

| | | |
|---|---|---|
| 4,113,353 A | 9/1978 | Matsushita |
| 4,872,000 A | 10/1989 | Kano et al. |
| 6,548,768 B1 | 4/2003 | Pettersson et al. |
| 6,663,008 B1 | 12/2003 | Pettersson et al. |
| 6,674,427 B1 | 1/2004 | Pettersson et al. |
| 6,870,192 B2 | 3/2005 | Yamazaki et al. |
| 6,894,746 B1 | 5/2005 | Manabe et al. |
| 7,170,094 B2 | 1/2007 | Yamazaki et al. |

(Continued)

FOREIGN PATENT DOCUMENTS

CN    1201170 C    5/2005
CN    101292215 A    10/2008

(Continued)

OTHER PUBLICATIONS

International Search Report issued in International Application No. PCT/JP2012/007520 with Date of mailing Feb. 12, 2013, with English Translation.

(Continued)

Primary Examiner — Kenneth B Lee, Jr.
(74) Attorney, Agent, or Firm — McDermott Will & Emery LLP

(57) ABSTRACT

Information display apparatus has a display panel comprising a display area where pixels of EL element are arranged in matrix, a source signal line supplying an image signal to the pixel, and a gate signal line supplying a signal controlling selection or non-selection of luminescence of the pixel. The display panel has a polarizing plate for polarizing an incident light. The display panel comprises a coordinate detection mark having the characteristics of changing the direction of incident light.

6 Claims, 27 Drawing Sheets

(56) References Cited

U.S. PATENT DOCUMENTS

| | | |
|---|---|---|
| 7,172,131 B2 | 2/2007 | Pettersson et al. |
| 7,248,250 B2 | 7/2007 | Pettersson et al. |
| 7,281,668 B2 | 10/2007 | Pettersson et al. |
| 7,588,191 B2 | 9/2009 | Pettersson et al. |
| 7,795,618 B2 | 9/2010 | Yamazaki et al. |
| 8,162,220 B2 | 4/2012 | Pettersson et al. |
| 8,227,807 B2 | 7/2012 | Yamazaki et al. |
| 8,466,408 B2 | 6/2013 | Miyazaki et al. |
| 8,519,392 B2 | 8/2013 | Yamazaki et al. |
| 8,534,566 B2 | 9/2013 | Pettersson et al. |
| 8,759,145 B2 | 6/2014 | Lee et al. |
| 8,895,983 B2 | 11/2014 | Yamazaki et al. |
| 2003/0062545 A1 | 4/2003 | Yamazaki et al. |
| 2004/0095337 A1 | 5/2004 | Pettersson et al. |
| 2004/0113893 A1 | 6/2004 | Pettersson et al. |
| 2004/0113898 A1 | 6/2004 | Pettersson et al. |
| 2005/0093804 A1 | 5/2005 | Yamazaki et al. |
| 2005/0104861 A9 | 5/2005 | Pettersson et al. |
| 2005/0162401 A1* | 7/2005 | Tseng et al. ............... 345/173 |
| 2006/0076416 A1 | 4/2006 | Pettersson |
| 2006/0220581 A1 | 10/2006 | Yamazaki et al. |
| 2009/0141001 A1 | 6/2009 | Kuroda et al. |
| 2009/0279170 A1 | 11/2009 | Miyazaki et al. |
| 2010/0096458 A1 | 4/2010 | Pettersson et al. |
| 2010/0328299 A1 | 12/2010 | Yamazaki et al. |
| 2011/0050648 A1 | 3/2011 | Lee et al. |
| 2012/0146027 A1* | 6/2012 | Tamura ............. H01L 27/14692 257/53 |
| 2012/0193419 A1 | 8/2012 | Pettersson et al. |
| 2012/0286273 A1 | 11/2012 | Yamazaki et al. |
| 2013/0341625 A1 | 12/2013 | Yamazaki et al. |
| 2015/0041817 A1 | 2/2015 | Yamazaki et al. |

FOREIGN PATENT DOCUMENTS

| | | |
|---|---|---|
| CN | 101887691 A | 11/2010 |
| CN | 102005162 A | 4/2011 |
| JP | 50-137630 | 10/1975 |
| JP | 56-044979 A | 4/1981 |
| JP | 63-026721 | 2/1988 |
| JP | 5-307438 A | 11/1993 |
| JP | 06-309084 A | 11/1994 |
| JP | 07-017304 A | 1/1995 |
| JP | 07-141104 A | 6/1995 |
| JP | 2002-082763 A | 3/2002 |
| JP | 2002-082771 A | 3/2002 |
| JP | 2003-511761 A | 3/2003 |
| JP | 2003-216104 A | 7/2003 |
| JP | 2003-256137 A | 9/2003 |
| JP | 2005-215676 A | 8/2005 |
| JP | 2006-085679 A | 3/2006 |
| JP | 3121410 U | 5/2006 |
| JP | 2008-026958 A | 2/2008 |
| JP | 2008-269545 A | 11/2008 |
| JP | 2009-037311 A | 2/2009 |
| WO | 01/26032 A1 | 4/2001 |
| WO | 2012-010441 A1 | 1/2012 |

OTHER PUBLICATIONS

Notice of Allowance dated Jul. 28, 2015 issued in corresponding Japanese Patent Application No. 2013-557250.
Japanese Office Action dated Apr. 7, 2015 issued in Japanese Patent Application No. 2013-557250.
Chinese Office Action and Search Report dated Apr. 1, 2016 issued in Chinese Patent Application No. 201280069115.5.

* cited by examiner

INFORMATION DISPLAY APPARATUS

RELATED APPLICATIONS

This application is a Continuation of International Application No. PCT/JP2012/007520, filed on Nov. 22, 2012, which in turn claims the benefit of Japanese Application No. 2012-024702, filed on Feb. 8, 2012, the disclosures of which Applications are incorporated by reference herein.

TECHNICAL FIELD

The present disclosure relates to a display device, such as EL display device having EL (Electro Luminescence) elements arranged in matrix, each of the elements employing an organic material as a luminescent material. Further, the present disclosure relates to an information display apparatus, that has coordinate detection marks formed on a display area of the display device, and that read out these marks using an input-pen.

BACKGROUND

There is a technology for specifying a position of image information formed on a printed media such as paper, by placing two dimensional codes including coded coordinate information coded on the print media.

To input a coordinate, one method is to use a stylus pen as an input pen which drives based on resistance pressure method, electric capacity method, or electromagnetic induction method. In the apparatus having such a tablet, the tablet is often used combined with display means such as liquid crystal displays. Coordinate range instructed on the tablet and corresponding position on a display screen of the display means are predetermined. When a stylus pen moves on the tablet, a cursor moves on the display screen.

As a related art of the present disclosure, there are Japanese patent literatures JP 2006-085679 A1, or JP 1995-017304 A1.

SUMMARY

An information display apparatus of the present disclosure includes a display panel having a display area where pixels of EL elements are arranged in matrix, a source signal line supplying an image signal to the pixel, and a gate signal line supplying a signal controlling selection or un-selection of luminescence of the pixel. The display panel has a polarizing plate polarizing an incidence light, and the display panel has a coordinate detection mark which has a characteristic of changing direction of the incidence light.

The foregoing structure allows specifying the position of coordinate easily even when an electronic pen is used, by detecting the lights which passed or reflected the coordinate detection mark using an image acquisition means.

DETAILED DESCRIPTION

An embodiment of an information display apparatus will be described hereafter with reference to the accompanying drawings.

Figure 1:
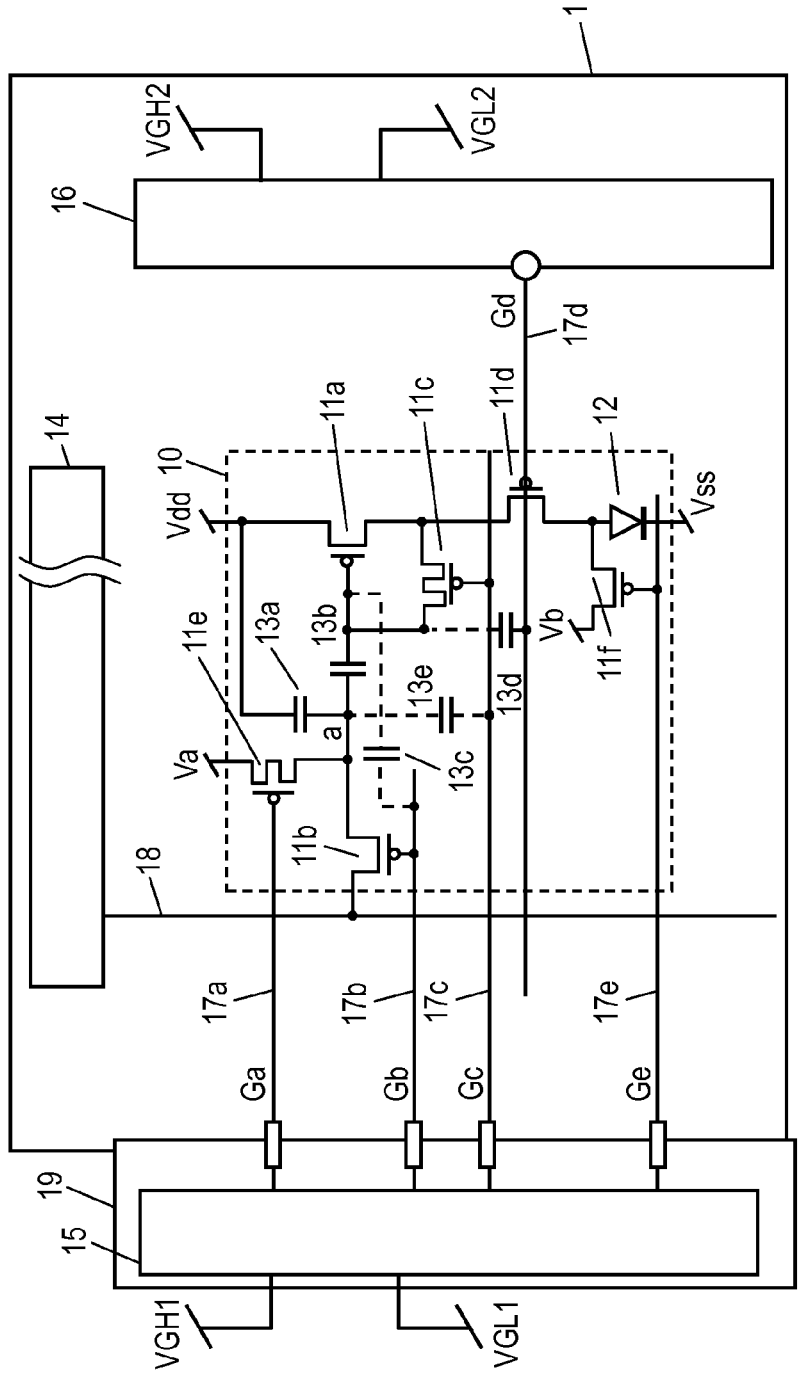
FIG. 1 illustrates a schematic structure of a pixel of an EL display device and an example of driving circuit according to an exemplary embodiment.

FIG. 1 illustrates a schematic structure of a pixel of an EL display device and an example of driving circuit according to one embodiment. In FIG. 1, only a portion of the EL display device is illustrated.

As illustrated in FIG. 1, EL display device is configured by EL display panel 1 and a wiring substrate mounted with a driving circuit. EL display panel 1 includes multiple pixels arranged in matrix, each of which has an EL element.

First, structure of the pixel is discussed. One pixel 10 has a structure where a drain terminal of a P-channel driving transistor 11a is connected to a source terminal of a switching transistor 11d, and a drain terminal of transistor 11d is connected to an anode terminal of EL element 12. Transistors 11b, 11c, 11e, and 11f are also switching transistors that are provided in pixel 10. Capacitors 13a, 13b, 13c, 13d, and 13e are for controlling ON/OFF of transistors 11a to 11f.

Cathode voltage Vss is applied to a cathode terminal of EL element 12. Anode voltage Vdd is applied from an anode electrode of EL display device to a source terminal of transistor 11a. Anode voltage Vdd and cathode voltage Vss are set so that they satisfy a relation of Vdd>Vss.

The driving circuit has source driver IC 14 working as a source driver circuit, and gate driver ICs 15 and 16 each working as a gate driver circuit. Source driver IC 14, gate driver ICs 15 and 16, and pixel 10 are electrically connected via gate signal line 17 (17a, 17b, 17c, 17d, and 17e) and source signal line 18. Gate driver IC 15 is mounted on flexible substrate (COF: Chip On Flexible) 19 working as a wiring substrate. Gate driver IC 16 is connected to EL display panel 1 via COF 19.

Gate signal lines shown in FIG. 1 are for supplying signals for controlling selection or non-selection of luminescence of pixel 10. When ON voltage is applied to gate signal line 17d (Gd), transistor 11d is turned ON. Then a luminous current is supplied from transistor 11a to EL element 12, which then emits light in response to the amount of the luminous current. This amount is determined by applying an image signal supplied to source signal line 18 to pixel 10 with the aid of switching transistor 11b.

Specifically, source and drain terminals of transistor 11c are connected between gate and drain terminals of transistor 11a, and the gate and drain terminals of transistor 11a are short-circuited, i.e. connected by applying ON-voltage to gate signal line 17b (Gb). A first terminal of capacitor 13b is connected to the gate terminal of transistor 11a, and a second terminal of capacitor 13b is connected to the drain terminal of transistor 11b. A source terminal of transistor 11c is connected to source signal line 18 via transistor 11b. When ON voltage of gate signal line 17c (Gc) is applied to a gate terminal of transistor 11c, which is then turned ON. Voltage Vs is applied to pixel 10 in response to an image signal supplied to source signal line 18.

First terminal of capacitor 13a of pixel 10 is connected to the drain terminal of transistor 11b. Second terminal is connected to the anode electrode of the EL display device and anode voltage Vdd is applied to this terminal.

A drain terminal of transistor 11e is connected to the drain terminal of transistor 11b. A source terminal of transistor 11e is connected to a signal line to which reset voltage Va is applied. Transistor 11e is turned on when ON voltage is applied to gate signal line 17a (Ga). As a result, reset voltage Va is applied to capacitor 13a.

Transistors 11c and 11e are P-channel transistors and have LDD (Lightly Doped Drain) structure. By connecting multiple transistors in series as such, off-characteristics of transistors 11c and 11e are improved. It is desirable to use P-channel and LDD structure for transistors other than transistors 11c and 11e. If necessary, a multi-gated structure transistor can be used to suppress an off-leak current and can achieve a satisfactory contrast and an offset cancelling operation.

Instead of applying anode voltage Vdd to capacitor 13a, other kinds of direct-current voltage can be applied. Similarly, a voltage other than anode voltage Vdd can be applied to transistor 11a. In other words, instead of applying the same voltage to capacitor 13b and the source terminal of transistor 11a, different voltages can be applied. For example, anode voltage Vdd can be applied to the source terminal of transistor 11a, and direct-current voltage Vb (5 Volts) can be applied to capacitor 13a.

When digital driving methods, such as PWM (Pulse Width Modulation) driving method which display images by blinking or digitally lighting a pixel 10, are employed, a predetermined voltage is applied to pixel 10 with the aid of transistor 11b, and then transistor 11d is turned ON or OFF in response to a binary data corresponding to a level of the image signal. ON/OFF state of transistor 11d is controlled to generate a belt-like black display (non-display) in display area 2, whereby an amount of current in display area 2 is controlled.

Next, function of capacitors 13c and 13d shown on dotted lines of FIG. 1 is discussed. Capacitor 13c is formed between gate signal line 17b and transistor 11a. Capacitor 13d is formed between gate signal line 17d and the gate terminal of transistor 11a. Capacitors 13c and 13d are called "punch-through capacitors", and the voltage which will be changed or the voltage which was changed is called "punch-through voltage".

When ON voltage ($V_{GL}$) is applied to gate signal line 17b of FIG. 1, transistor 11b is in ON state, and an image signal applied to source signal line 18 is thus supplied to pixel 10. Next, when the voltage applied to gate signal line 17b changes from ON-voltage $V_{GL}$ to OFF-voltage $V_{GH}$, transistor 11b is turned off. Simultaneously, the voltage of one terminal of capacitor 13c is turned from $V_{GL}$ to $V_{GH}$ and voltage based on this change is transmitted to the gate terminal of transistor 11a. The transmitted voltage increases the gate terminal voltage of transistor 11a. Since transistor 11a is a P-channel transistor, the voltage-change decreases the current supplied from transistor 11a to EL element 12. As a result, a satisfactory black display state can be thus achieved.

As discussed above, black level is appropriately displayed as black by changing the gate terminal voltage (electrical potential of capacitor 13e) of driving transistor 11a with the aid of capacity of capacitor 13c.

When transistor 11d is ON, voltage $V_{GL2}$ is applied to gate signal line 17d. When transistor 11d is OFF, voltage $V_{GH2}$ is applied to gate signal line 17d. Transistor 11d is in OFF state during an offset cancellation operation, and transistor 11d is in ON state when light is emitted from EL element 12. Therefore, voltage of gate signal line 17d changes from voltage $V_{GH2}$ to voltage $V_{GL2}$ at the beginning of displaying. The voltage of the gate terminal of transistor 11a decreases due to function of punch-through capacitor 13d. The decrease of the gate terminal voltage of transistor 11a enables this transistor to supply a large current to EL element 12, and high-brightness display can be thus achieved.

By changing the gate terminal voltage of transistor 11a with the aid of the capacity of capacitor 13d, the amplitude of EL element can be increased and can display images of high-brightness.

The capacity of capacitor 13c is desirably between 1/12 to 1/3 (inclusive) of capacity of capacitor 13a or 13b. When the capacity ratio of capacitor 13c is too small, the gate terminal voltage of transistor 11a changes largely and the difference from the ideal value, i.e. value when an offset is cancelled, becomes too large. When the capacity ratio of capacitor 13c is too large, change in the gate terminal voltage of transistor 11a decreases and cannot obtain sufficient effect.

The gate terminal voltage of driving transistor 11a can be changed not only directly by capacitor 13c, but also indirectly using another capacitor.

FIGS. 2A to 2D illustrate operations of a pixel of EL display device in one embodiment. Lighting operation of pixel 10 is detailed with reference to FIGS. 2A to 2D. The illustrations of writing operation of an image signal to a pixel and luminescence operation of EL device 12 proceed in order of FIGS. 2A, 2B, 2C and 2D.

Figure 2A:
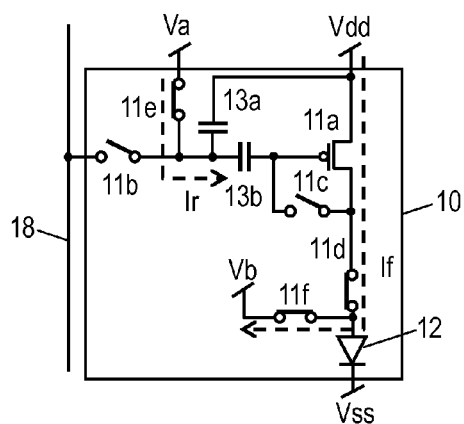
FIG. 2A illustrates an initial operation of a pixel of an EL display device according to an exemplary embodiment.

FIG. 2A illustrates an initial operation of a pixel of an EL display device according to one embodiment. The initialization operation is executed following a horizontal synchronizing signal (HD). ON voltage is applied to gate signal lines 17a, 17d, and 17e of FIG. 1 to turn on transistors 11d, 11e, and 11f. OFF voltage is applied to gate signal lines 17b and 17c to turn off transistors 11b and 11c. Reset voltage Va is applied to one terminal of capacitor 13a from a signal line to which reset voltage Va is applied.

Offset-cancellation current (If) flows into transistor 11a, where the current (If) from source-terminal potential Vdd toward direct-current voltage Vb via channels of transistors 11a, 11c, and 11f, and the voltage Vb is applied to a drain-terminal electrode of transistor 11f. The foregoing voltages satisfy the following relations:

anode voltage $Vdd$>direct-current voltage $Vb$, and reset voltage $Va$>direct-current voltage $Vb$.

The drain-terminal potential of transistor 11a falls due to offset-cancellation current (If). Reset voltage Va is applied to a terminal of capacitor 13b when reset current Ir flows due to reset voltage Va.

The transistor 11a is turned on and offset-cancellation current (If) flows for a short period. Transistor 11a becomes operable by this offset-cancellation current (If) because a drain-terminal voltage of transistor 11a decreases at least below anode voltage Vdd.

Figure 2B:
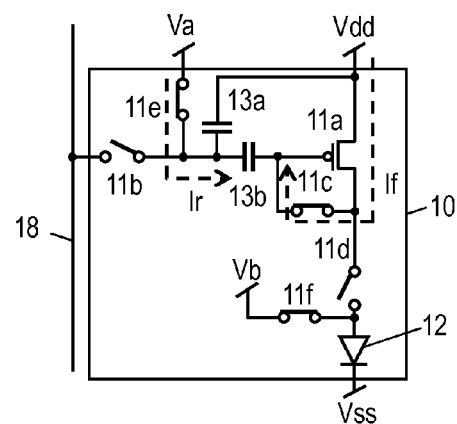
FIG. 2B illustrates a reset operation of a pixel of an EL display device according to an exemplary embodiment.

FIG. 2B illustrates a reset operation of a pixel of an EL display device according to one embodiment. ON voltage is applied to gate signal line 17c of FIG. 1, and OFF voltage is applied to gate signal line 17d. Transistor 11d is thus turned off and transistor 11c is turned on.

Offset-cancellation current (If) flows toward the gate terminal of transistor 11a by turning transistor 11d OFF and turning transistor 11c ON. Offset-cancellation current (If) is comparatively large at beginning. This current decreases as the gate-terminal potential of transistor 11a increases and approaches the OFF state. Finally, the current value reaches to 0 (μA) or to a value near 0 (μA).

As a result of above operation, transistor 11a is turned to an offset-cancellation state. An offset-cancellation voltage is stored in capacitor 13b. In capacitor 13b, one terminal is maintained at reset voltage Va and the other terminal, i.e. the terminal connected to a gate terminal of transistor 11a, is maintained at the offset-cancellation voltage.

Figure 2C:
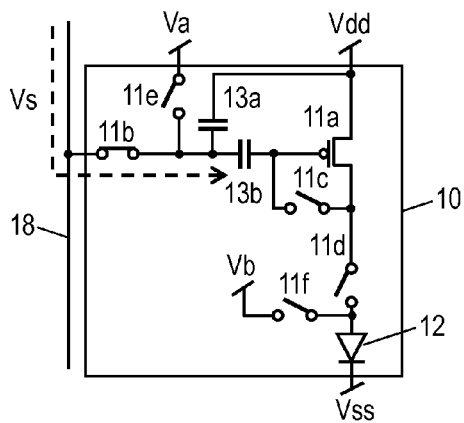
FIG. 2C illustrates a program operation of a pixel of an EL display device according to an exemplary embodiment.

FIG. 2C illustrates a program operation of a pixel of an EL display device according to one embodiment. In the program operation, OFF voltage is applied to gate signal lines 17a, 17c, and 17d of FIG. 1 to turn off transistors 11e, 11c, and 11d. ON voltage is applied to gate signal line 17b to turn on transistor 11b.

On the other hand, image signal voltage Vs is applied to source signal line 18. Image signal voltage Vs is also applied to capacitor 13b when transistor 11b is turned on. One terminal of capacitor 13b then changes its potential from reset voltage Va to image signal voltage Vs. As a result, voltage corresponding to sum of image signal voltage Vs and the offset-cancellation voltage is stored in capacitor 13b.

Image signal voltage Vs is the voltage based on anode voltage Vdd. Anode voltages Vdd are different in the panel due to a voltage drop of wiring inside the panel. Thus, image signal voltage Vs is changed or controlled based on anode voltage Vdd applied to a pixel.

Figure 2D:
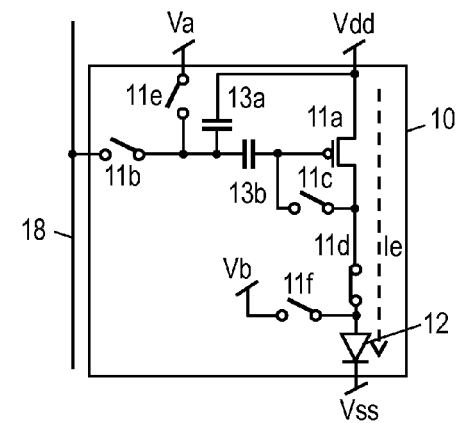
FIG. 2D illustrates a luminescence operation of a pixel of an EL display device according to an exemplary embodiment.

FIG. 2D illustrates a luminescence operation of a pixel of an EL display device according to one embodiment. Subsequent to the program operation of FIG. 2C, OFF voltage is applied to gate signal line 17b of FIG. 1, and transistor 11b is turned to OFF state. Pixel 10 is thus separated from source signal line 18. ON voltage is applied to gate signal line 17d, and transistor 11d is turned on. Luminous current Ie from transistor 11a is then supplied to EL element 12. EL element 12 emits light based on the supplied luminous current Ie.

In FIGS. 1 and 2A to 2D, transistor 11f can be omitted. In this structure, offset-cancellation current (If) can flow into EL element 12 when transistor 11d in FIG. 2A is turned ON. Although EL element 12 emits light in response to the current (If), EL element 12 emits light for very short time because the current (If) flow for period of only 1 μs or less. Thus, decrease in contrast of EL display (EL display panel) is very small in this embodiment.

Source driver IC 14, working as a source driver circuit, can have not only a driver function but also other circuits, such as power supply circuit, buffer circuit (including shift register), data conversion circuit, latch circuit, command decoder, shift circuit, address conversion circuit, and image memory.

In gate driver IC 16A, a shift register and an output buffer circuit can be configured by P channel transistor and capacitor. When they are configured using P channel transistor only, the number of masks used in a process is reduced and can lower the cost of the panel.

Transistors 11a to 11f can be made of any of high temperature poly-silicon, low temperature poly-silicon, continuous grain boundary silicon, transparent amorphous oxide semiconductor, amorphous silicon, or infrared RTA (Rapid Thermal Annealing). When these transistors are made by top-gate structure, parasitic capacitance is reduced, and a gate electrode pattern in the top-gate can work as a shading layer. This shading layer can intercept the light emitted from EL element 12, and can reduce a malfunction of the transistor and OFF leakage current.

Gate signal line 17 or source signal line 18, or both of them are desirably made of wiring material that can adopt a process of copper wiring or copper alloy wiring because wiring resistance can be reduced and can produce large-sized EL display panels.

Figure 3:
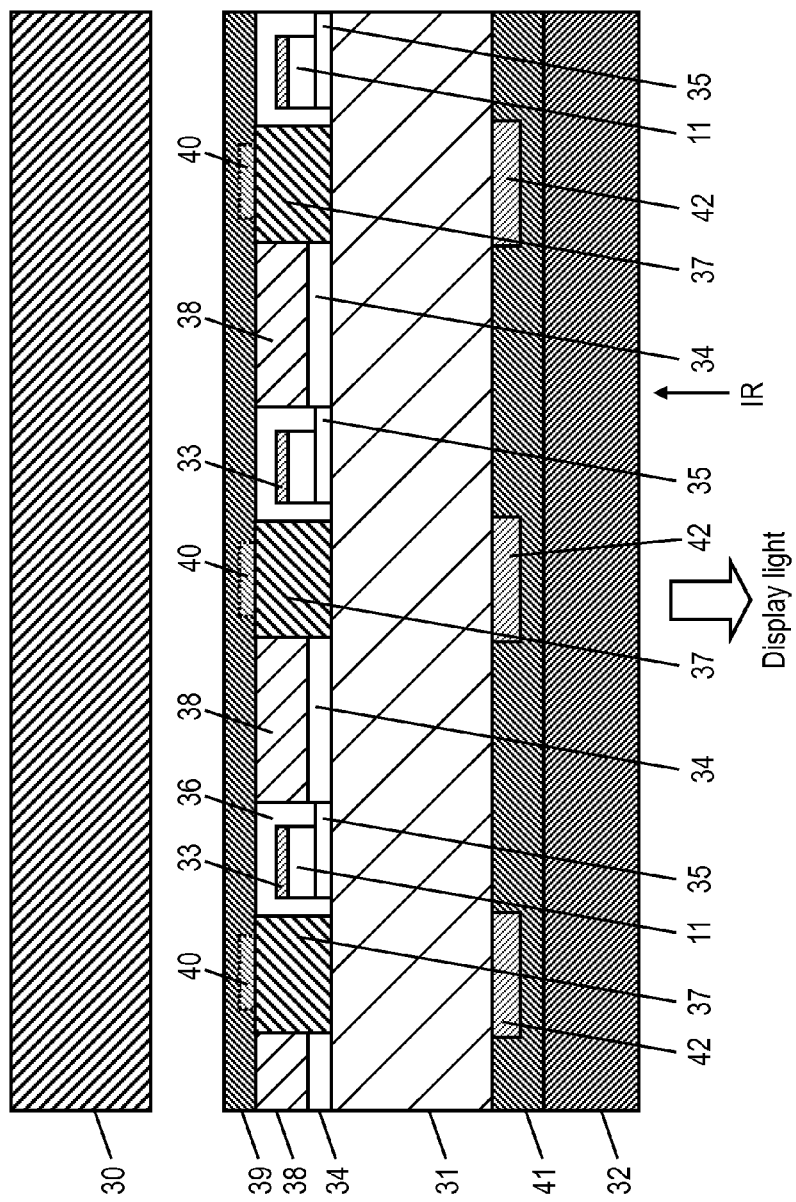
FIG. 3 is a cross sectional view illustrating an example of an EL display panel of an EL display device according to an exemplary embodiment.

FIG. 3 is a cross sectional view illustrating an example of an EL display panel of an EL display device according to one embodiment. As shown in FIG. 3, seal board 30 is disposed at back side of EL display panel and array substrate 31 is disposed at the display surface side. On a display surface of array substrate 31, polarizing plate 32 made of circular polarizing film, circular polarizing filter, or circular polarizing sheet is disposed. Array substrate 31 can be made of material having light transmittance, such as glass substrate, silicon wafer, metal substrate, ceramic substrate, or plastic sheet. For improving heat dissipation characteristics, sapphire glass can be also used. Seal board 30 can be made of material similar to that of array substrate 31. To prevent a deterioration of EL material, which is weak to humidity, desiccant (not shown) is disposed in a space between seal board 30 and array substrate 31. The peripheral portion of seal board 30 and array substrate 31 are sealed by seal resin (not shown).

Further, temperature sensor (not shown) is disposed in a space between seal board 30 and array substrate 31 or on the surface of seal board 30. Duty ratio or lighting ratio of EL display panel is controlled based on the output result from this temperature sensor. Operation speed of the gate driver circuit can be adjusted based on a detected output of the temperature sensor at the time of panel inspection.

Polarizing plate 32 is configured by affixing ¼ phase difference film (quarter wave plate) to linear polarizing film. When the ¼ phase difference film is affixed to direction of 45 degrees against the absorption axis of the linear polarizing film, polarizing plate 32 works as a right circular polarizing plate. When the ¼ phase difference film is affixed to the direction of 135 degrees, i.e. −45 degrees, polarizing plate 32 works as a left circular polarizing plate. Reflection of outdoor light inside the panel can be reduced by overlapping the left and right circular polarizing plates sandwiching the phase difference films. Polarizing plate 32 can be other then circular polarizing films, filters, or plates. It can be a material which converts to elliptical polarizing light or linear polarizing light. The quarter wave plate can be made of material other than phase difference film. It can be an element employing crystal of quartz or isinglass that can changes phase. For phase difference films, a film made of uniaxially-stretched polycarbonate, cycloolefin-polymer can be used, and retardation at wavelength of 550 nm is desirably set between 120 to 150 nm. Polarizing plate 32 can be made by forming an aluminum thin film on a glass wafer and then inserting a micro-fabricated slit so that the plate 32 can have a polarizing function.

First, the structure of TFT (Thin Film Transistor) array substrate side will be described. Referring to FIG. 3, color filters of RGB (Red, Green, and Blue) are formed inside array substrate 31. The color filter can have colors other than RGB, for example, pixels of cyan (C), magenta (M), or yellow (Y) can be formed. Further, white (W) can be used. One pixel for color-display is made so that a unit of three pixels of RGB forms a square shape. Aperture ratios of pixels of R, G, and B can be different. Current densities of EL elements 12 of RGB in each of the pixels can be set differently by setting aperture ratios different. This preparation allows EL elements 12 of RGB to deteriorate at the same speed.

Besides using color filter as discussed above, the color-display of EL display panel 1 can be also performed by forming EL layer of blue luminescence and then converting the emitted blue-color light to RGB using RGB color conversion layers.

Each of the pixels formed on array substrate 31 has multiple transistors 11 as illustrated in FIG. 1. Between each of the pixels, gate signal lines (not illustrated) are disposed. Shading film 33 is formed on transistor 11. Shading film 33 can be formed also on the lower layer of transistor 11 and on the lower or upper layer of the gate driver circuit if necessary. Anode electrode 34, which is a pixel electrode, and transistor 11 are connected together electrically by connecting portion 35. Anode electrode 34 is made of transparent electrode such as ITO (Indium Tin Oxide), IGZO (Indium Gallium Zinc Oxygen), IZO (Indium Zinc Oxide), Mg—Ag.

Shading film 33 is formed by metal thin films, such as chromium, and the film thickness is set between 50 nm to 150 nm. When film thickness of shading film 33 is small, shading effect is not sufficient. When film thickness is large, patterning of upper transistor 11 is difficult because surface roughness can occur. On a color filter, insulated film 36 working as an interlayer insulation film is formed covering transistor 11, a gate signal line, and a source signal line (not shown), and black matrix (not shown) is formed between color filters.

In insulated film 36, connecting portion 35 is disposed for connecting transistor 11 on the array substrate 31 side to anode electrode 34 on the luminescence unit side. Insulated film 36 is formed with film thickness of 2.0 µm or less. When the film thickness of insulated film 36 is 0.4 micron or less, insulation between layers is not sufficient, and when the film thickness is 2.0 µm or more, formation of connecting portion 35 is difficult and causes contact failure.

Next, the structure of the luminescence unit side will be described. Referring to FIG. 3, ribs 37 are formed in the peripherals of anode electrode 34 so as to divide the pixels individually. EL layers 38 of RGB are formed inside rib 37. Cathode electrode 39 is formed on EL layer 38 so that EL layer 38 is surrounded by anode electrode 34 and cathode electrode 39. Cathode electrode 39 can be made of silver (Ag), aluminum (Al), magnesium (Mg), calcium (Ca) or alloy thereof, or can be made of transparent electrodes, such as ITO, IGZO, and IZO.

Reflective film 40 is formed on cathode electrode 39 in a portion corresponding to rib 37. When an outdoor light enters from polarizing plate 32 to EL display panel 1, about 43% of the light is absorbed by polarizing plate 32 and the remainder penetrates. The penetrated light is converted to right circular polarized light in a phase film, and the polarization direction is reversed when reflected at reflective film 40. As a result, the light comes back to polarizing plate 32 again as a left circular polarized light. However, polarizing plate 32 penetrates right circular polarized light only and absorbs left circular polarized light. As a result, the reflected outdoor light becomes nearly equal to zero.

Structure of polarizing plate 32 portions will be discussed. As illustrated in FIG. 3, polarizing plate 32 is adhered to array substrate 31 by adhesive layer 41. Adhesive layer 41 can be either thermal curing type or thermal plastic type, but desirably has a sufficient light transmittance. The thermo plastic type adhesion material can be an adhesion material made of polyethylene, polypropylene, polystyrene, ABS (Acrylonitrile-Butadiene-Styrene) resin, vinyl chloride resin, methyl methacrylate resin, nylon, a fluoro-resin, polycarbonate, polyester resin, or acrylic resin. The thermal curing type adhesion material can be an adhesion material made of phenol resin, urea resin, melamine resin, epoxy resin, or polyurethane resin. Adhesive layer 41 is not limited to adhesion material, but can be an optical coupling material, such as ethylene glycol and salicylic acid methyl.

At lower layer of polarizing plate 32, coordinate detection mark 42 having light scattering and diffraction grating characteristics is formed on the surface of array substrate 31 for controlling direction of incident light. This coordinate detection mark 42 can adjust transmission rate or dispersion degree by coating amount of light scattering material. The light scattering material can be made of calcium based light scattering resin material diffused with titanium oxide, aluminum oxide, or magnesium oxide. The light scattering material can be also made of opal glass which diffuses light, or a solvent dispersed with white pigment or beads of glass or ceramics. Light scattering polymer light-guiding object having functions of both light guiding and light scattering formed with a micro uneven structure inside a polymer matrix can be also used.

Coordinate detection mark 42 can be made of material which scatters, reflects or absorbs a light of predetermined wavelength, such as infrared (IR) light. Further, the mark 42 can be formed of pigment used for coloring a film, or a material including body pigment for making film uneven or for scattering light. The body pigment can be a mat material of a tracing film, a material for improving ink absorbency of ink-jet, or a light scattering material for scattering film. Further, metal oxide for raising conductivity such as antimony dope tin oxide, aluminum powder such as adhesive silver paste can be used. Coordinate detection mark 42 can be an asperity surface for disarranging the entering circular polarized light. The mark 42 can be a rough surface or white turbidity surface made by oxidization or etching the surface. The mark 42 can be also made of phase changing material. For example, array substrate 31 can be coated by optical resin and then hardened, while coordinate detection mark 42 is pressed, rolled and heated. Optical phase difference is thus formed. Film of uniform phase can be attached on array substrate 31, and then coordinate detection mark 42 can be pressed, rolled and heated to generate the optical phase difference.

Since coordinate detection mark 42 has light scattering and diffractive characteristics, the light entering coordinate detection mark 42 reflects at the mark 42 and circular-polarized state is disarranged. As a result, a portion of the light penetrates polarizing plate 32 which enables user to detect coordinate detection mark 42 by outdoor daylight (IR).

As discussed above, EL display device of the present disclosure has coordinate detection mark 42 which enables light entering inside the panel from the outside is reflected (dispersed, diffused, diffracted, phase changed, or inflected) by coordinate detection mark 42 and light is again emitted outside of the panel. Coordinate detection mark 42 is thus detected.

The example of FIG. 3 relates to a structure where the light is emitted from the array substrate 31 side. Instead, an EL display panel having a structure where the light is emitted from the luminescence unit side can be employed.

Figure 4:
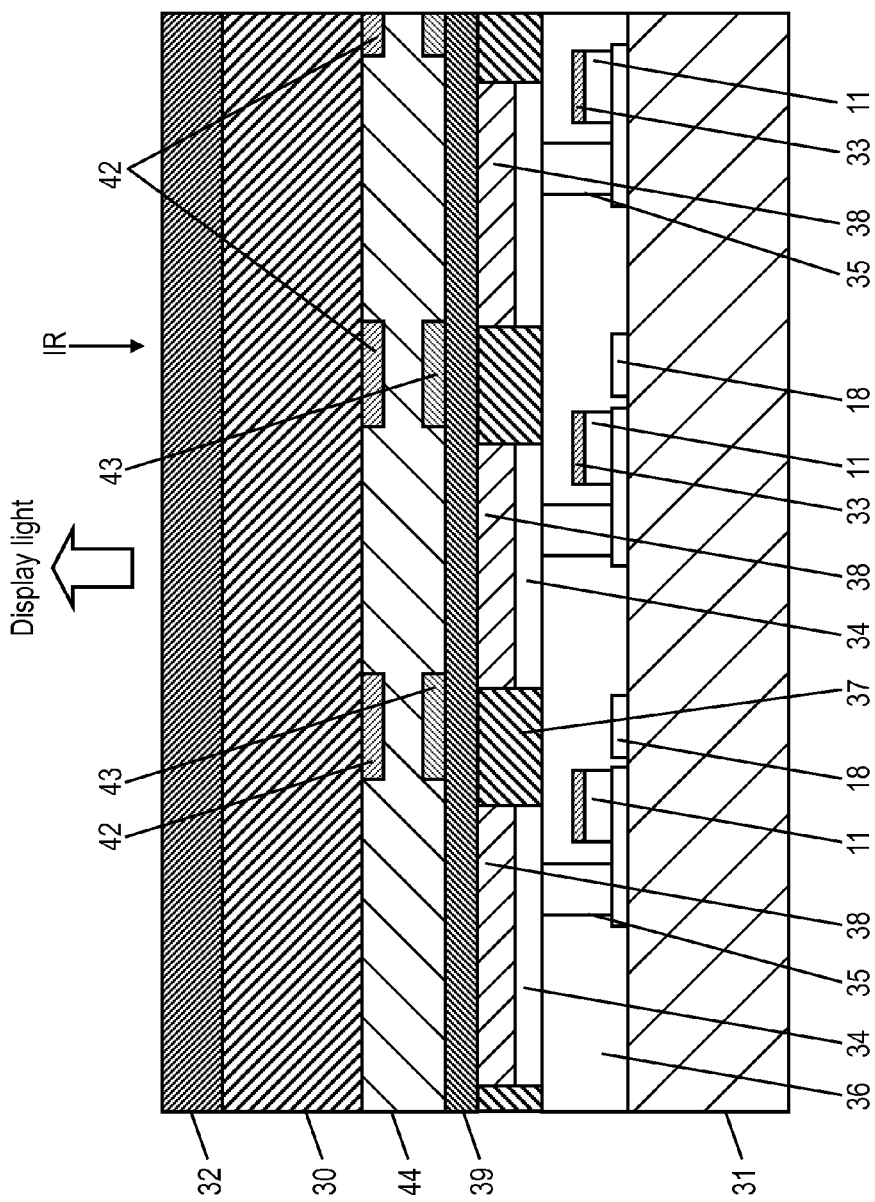
FIG. 4 is a cross sectional view illustrating another example of an EL display panel of an EL display device according to an exemplary embodiment.

In the panel illustrated in FIG. 4, low resistance wiring 43 is formed in the upper layer or lower layer of cathode electrodes 39, where the wiring 43 is made of layered structure of metals selected from chromium (Cr), aluminum (Al), titanium (Ti), or copper (Cu), or of alloy metal thin film made of multiple metal materials. Seal film 44 covers cathode electrodes 39 so as to also cover the wiring 43. Seal board 30 made of a glass substrate or light transmittance film is then adhered to seal film 44. Polarizing plate 32 is disposed by attaching this to the display surface side of seal board 30, and detection mark 42 is formed in seal film 44 side.

In the example of FIG. 4, reflective film 40 can be also formed as shown in FIG. 3 so that the light disarranged by coordinate detection mark 42 can reflect better.

Figure 5:
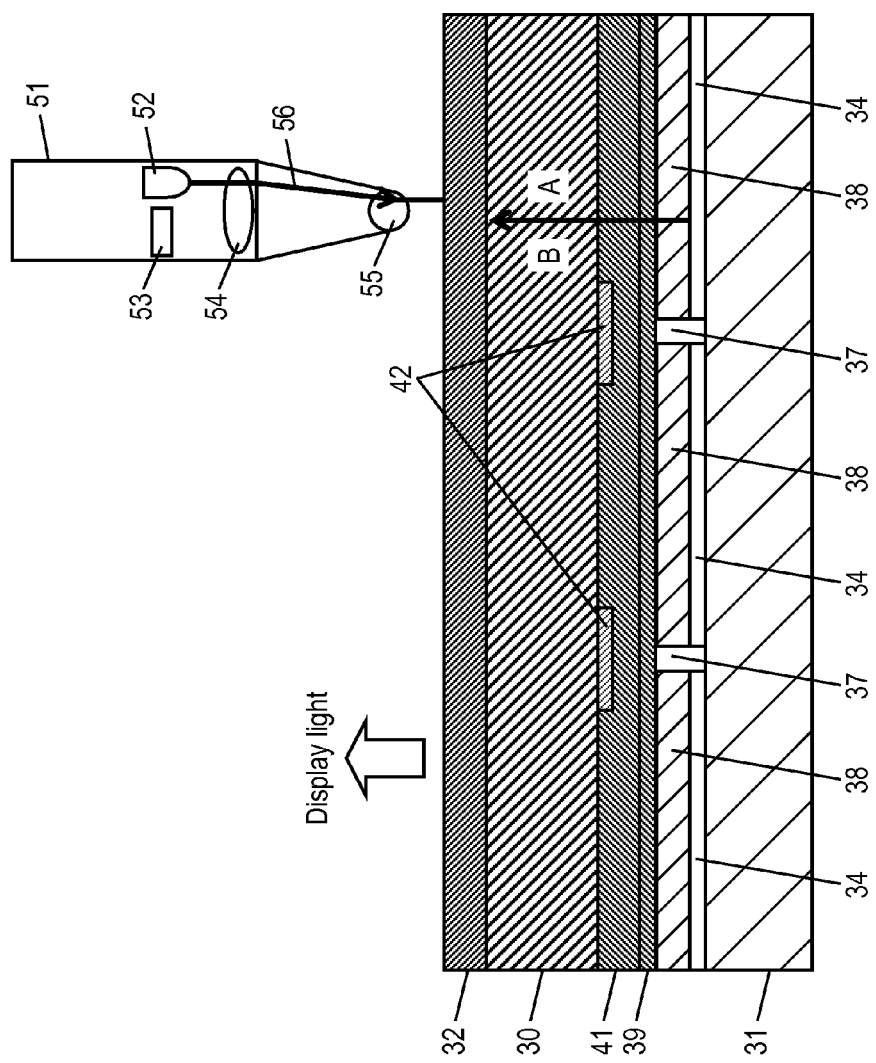
FIG. 5 illustrates an example of an information display apparatus employing an EL display device according to an exemplary embodiment.
Figure 6:
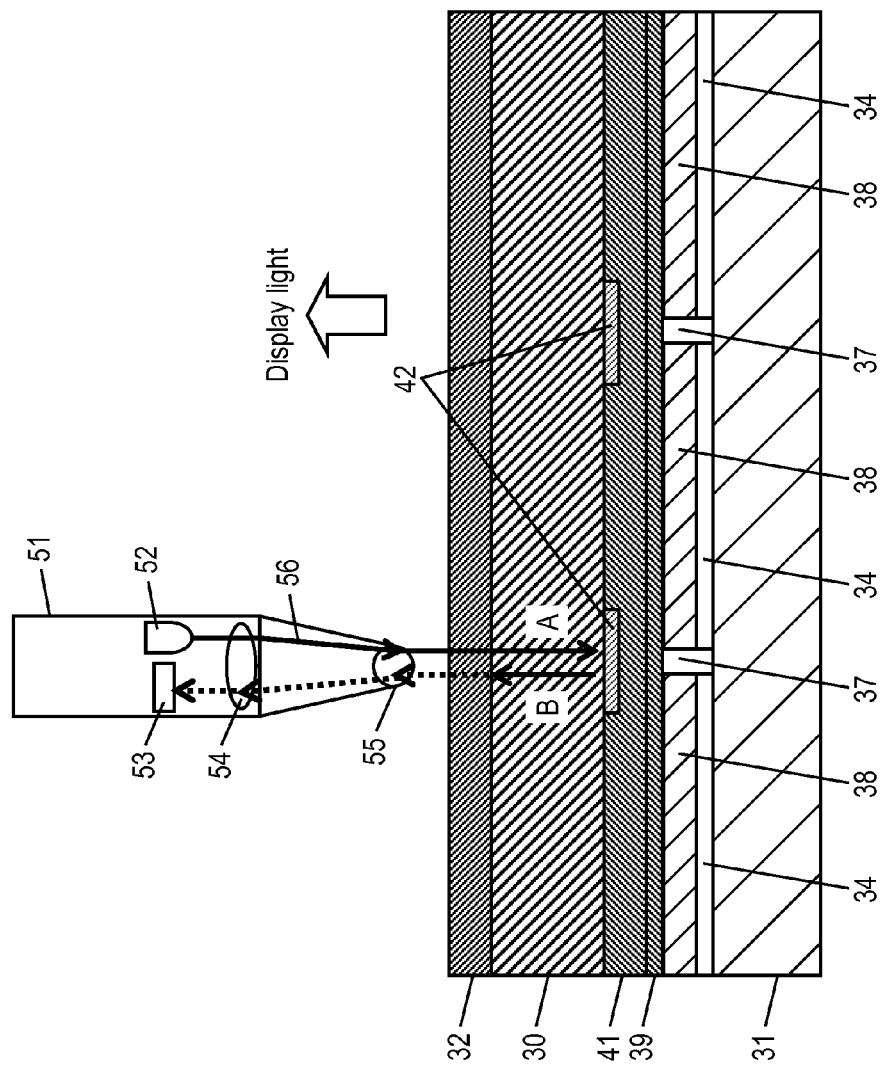
FIG. 6 illustrates an example of an information display apparatus employing an EL display device according to an exemplary embodiment.

FIGS. 5 and 6 illustrate an example of an information display apparatus employing an EL display device according to one embodiment. This embodiment regards to an example of employing an EL display device of FIG. 4. FIGS. 5 and 6 illustrate a portion relative to the present disclosure.

As illustrated in FIG. 5, LED (IR-LED) 52 working as a light generating means for emitting infrared rays (IR) 56 and CCD 53 working as an image acquisition means for capturing an image of predetermined range including coordinate detection mark 42 are built inside electronic pen 51. LED 52 is not limited to infrared rays (IR) and can be an LED which emits visible light or ultraviolet rays. IR has an advantage that it is separable from visible light emitted from EL display panel. Visible light has an advantage that the coordinate input position (coordinate acquisition position) can be recognized visually. When LEDs of visible light are used, it is desirable that RGB colors or light intensity can be controlled based on the preference.

LED 52 irradiates EL display panel 1 with continuous infrared rays 56. Led 52 can also irradiate the panel 1 with pulsed infrared rays 56 synchronizing with vertical or horizontal synchronizing signals of the display image. Infrared rays 56 transmit condenser lens 54 and ball shaped tip lens 55, and are irradiated to EL display panel 1 (see locus A). Fluorite can be used as condenser lens 54 and tip lens 55. Fluorite is light weighted, and its transmission rate and refractive index have very small dispersions on wavelength. Thus, range of light transmission wavelength is large. Using this abnormal partial dispersion characteristic, an optical system having very small chromatic aberrations can be formed combining with conventional optical glass.

Use of tip lens 55 enables an optical axis of CCD 53 to coincide with a central axis of electronic pen 51. Tip lens 55 is not limited to spherical lens, and can be combined with convex lens or concave lens.

The light reflected by EL display panel 1 (see locus B) transmits tip lens 55 and condenser lens 54 to enter CCD 53. The angle between the optical axis of CCD 53 and the central axis of electronic pen 51 is preferably less than 15 degrees (DEG.). Further, the angle is preferably less than 10 degrees (DEG.).

A combination of CCD 53 and condenser lens 54 works as a camera. Instead of CCD 53, other photo acceptance units, such as photo-transistor and photo-diode can be used. In this case, a liquid crystal shutter, having lattices of product of (6-dot times 3) and (6-dot times 3), is provided between condenser lens 54 and the photo acceptance unit.

Liquid crystal shutter controls light transmission and interception for each of the lattices so that dot readout information included in coordinate detection mark enters the light acceptance surface of the photo acceptance unit for each of the dots. Resolution similar to the light acceptance surface is thus achieved.

Electronic pen 51 is configured so that the information on a predetermined area in a display screen can be readout. When the tip of electronic pen 51 touches a display screen, the pen 51 read out the optical information in the position. Infrared ray 56 emitted from electronic pen 51 transmits polarizing plate 32, and changes to a circular polarized light A. In FIG. 5, circular polarized light A reflects at reflective film 40 and the polarization direction of reflected light B becomes opposite. Reflected light B enters a phase difference film (not shown) of polarizing plate 32, and changes to linear polarization light. However, since this linear polarization is perpendicular to the polarization axis of polarizing plate 32, the light is absorbed by a polarizing film (not shown) of polarizing plate 32. Thus, light does not emit from polarizing plate 32.

Referring to FIG. 6, infrared rays 56 emitted from electronic pen 51 transmits polarizing plate 32 and becomes circular polarized light A. Circular polarized light A is irradiated to coordinate detection mark 42 of FIG. 6. Coordinate detection mark 42 is made of a light scattering material. Thus, at least a portion of reflected light B is scattered and circular polarization is disarranged as a result. Reflected light B enters a phase difference film (not shown)

of polarizing plate 32, but the light disarranged by coordinate detection mark 42 does not turn to linear polarization. In other words, lights having two different polarization axes are mixed. Therefore, the light which coincides with the polarization axis of the polarizing film of polarizing plate 32 is emitted from EL display panel 1.

Regarding the light from pixel 10 of EL display panel 1, only the light which coincides with the polarization axis of polarizing plate 32 emits from EL display panel 1.

As discussed above, regarding infrared rays 56 emitted from electronic pen 51, portion of the light reflected by coordinate detection mark 42 emits from EL display panel 1. The light reflected at anode electrode 34 of pixel 10 does not emit from EL display panel 1. Therefore, coordinate detection mark 42 can be recognized when the light entering coordinate detection mark 42 enters CCD 53.

Figure 7:
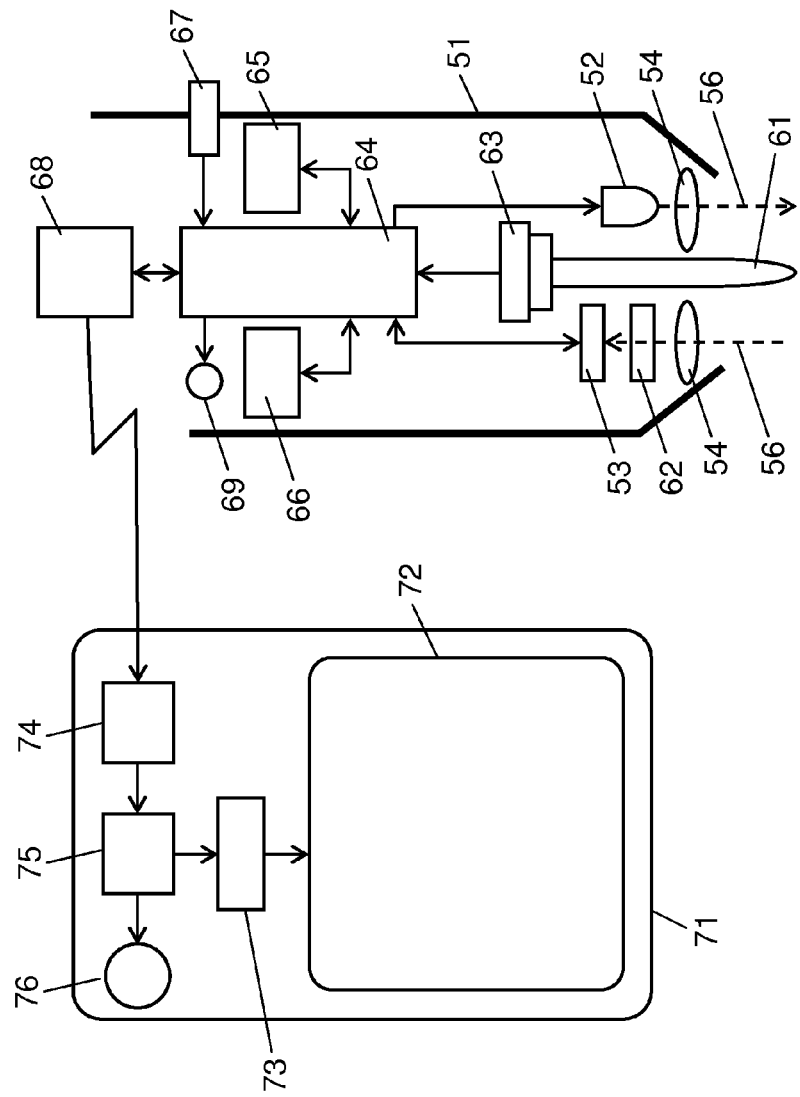
FIG. 7 is a schematic diagram illustrating a basic structure of an electronic pen and a tablet terminal according to an exemplary embodiment.

FIG. 7 is a schematic diagram illustrating a basic structure of an electronic pen and a tablet terminal. The structure illustrated in FIGS. 5 and 6 regards to electronic pen 51 having a tip lens 55. Instead, the structure of FIG. 7 has nib 61. FIG. 7 also shows information equipment, such as tablet terminal 71 employing a display panel. Tip lens 55 can be attached to nib 61.

As illustrated in FIG. 7, in addition to LED 52, CCD 53, and condenser lens 54, electronic pen 51 further has nib 61, infrared filter (IR filter) 62, pressure sensor 63, MPU (processing circuit) 64, acceleration sensor 65, angle sensor 66, switch 67, transmitting unit 68, and display LED 69 etc. Tablet terminal 71 has display screen 72 of EL display panel 1, panel drive circuit 73, receiving unit 74, MPU (processing circuit) 75, and speaker 76.

Infrared ray 56 emitted from LED 52 of electronic pen 51 is condensed by condenser lens 54 and illuminates display screen 72. Infrared rays 56 reflected by display screen 72 is condensed by condenser lens 54. Then infrared filter (IR filter) 62 cuts off visible light and transmits infrared light. The transmitted infrared ray 56 enters CCD 53.

The light in a readout area in a predetermined range out of display screen 72 is condensed on an acceptance surface of CCD 53 by condenser lens 54. CCD 53 then reads out the image of coordinate detection mark 42 included in the readout area. The image information read by CCD 53 is transmitted to MPU (processing circuit) 64.

Figure 8:
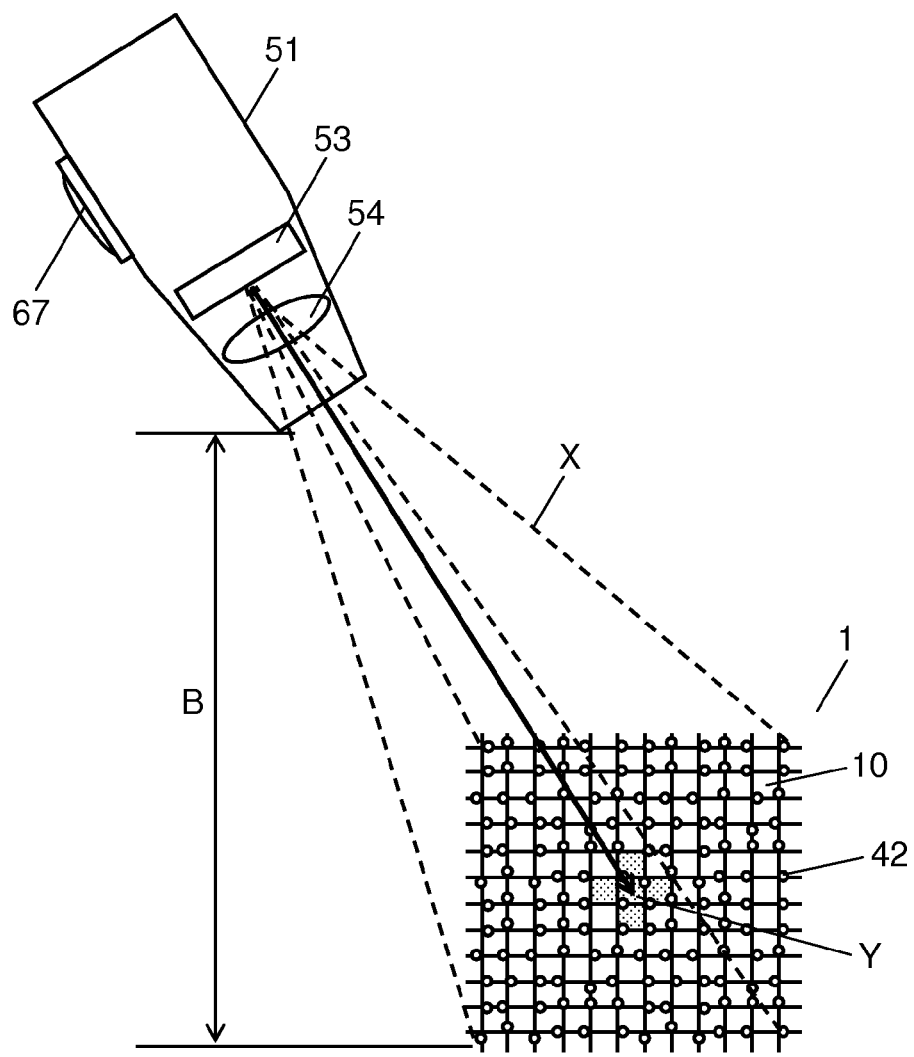
FIG. 8 illustrates an example of information readout.

FIG. 8 illustrates an example of information readout. As shown in FIG. 8, pixel 10 and coordinate detection mark 42 are imaged on CCD 53 in a position away from the display surface of EL display panel 1 by distance of B. The capturing range X, where CCD 53 of FIG. 8 can capture an image, is 50 times 50 dots (50 times 50 pixels) or more and 200 times 200 dots or less. When one coordinate detection mark 42 is formed in one pixel, 50 times 50 or more and 200 times 200 or less numbers of coordinate detection marks 42 is captured. The captured and detected coordinate position Y of coordinate detection mark 42 is displayed by mark of "+" on display screen 72 of EL display panel 1, for example.

Data readout by electronic pen 51, e.g. position data of coordinate detection mark 42 is transmitted to MPU (processing circuit) 64. MPU (processing circuit) 64 recognizes a dot image included in coordinate detection mark 42, processes a data of the recognized dot image, and detects the coordinates of the position where electronic pen 51 has pointed.

MPU (processing circuit) 64 converts readout image information to a data signal and transmits to transmitting unit 68. Transmitting unit 68 transmits the coordinate data to receiving unit 74 of tablet terminal 71 by wireless communication.

The receiving data received by receiving unit 74 of tablet terminal 71 is processed by MPU (processing circuit) 75, and speaker 76 outputs sound based on whether electronic pen 51 is contacted to panel surface or not. Panel drive circuit 73 is also controlled. Panel drive circuit 73 displays the coordinate position recognized by electronic pen 51 on display screen 72.

The series of above reading operations are performed when the tip of electronic pen 51 is in contact with display screen 72. Pressure sensor 63 formed on a bonding part of condenser lens 54 outputs a signal to MPU (processing circuit) 64 for indicating condenser lens 54 is in contact with display screen 72. In response to this signal, MPU (processing circuit) 64 operates so as to process the signal read out and outputted by CCD 53.

In the structure discussed above, readout is operated when the tip of electronic pen 51 is in contact with display screen 72. Instead, a switch that user can input a reading instructions can be formed, and a reading operation can be performed in response to a pushing operation of the switch. The reading operation is thus performed even when electronic pen 51 is not in contact with display screen 72.

Regarding to means for transmitting an output signal of electronic pen 51 to MPU (processing circuit) 64, besides using signal line 46, the signal can be transmitted by infrared transmission. In other words, electronic pen 51 can be used as a wireless instruction means.

Nib 61 is in contact with pressure sensor 63. When nib 61 contacts EL display panel 1, pressure is applied to pressure sensor 63 and information indicating that nib 61 is contacted to display panel is transmitted to MPU (processing circuit) 64.

Angle sensor 66 detects the angle of electronic pen 51. This is necessary because coordinate position of the nib varies according to inclination of electronic pen 51. When electronic pen 51 is perpendicular, coordinate of the nib is just below electronic pen 51. When electronic pen inclines largely, coordinate of the nib comes to a position far away from the position just below electronic pen 51.

Angle sensor 66 measures the inclination of electronic pen 51, and transmits the inclination data of electronic pen 51 to MPU (processing circuit) 64. MPU (processing circuit) 64 determines the position where user is writing by compensating the position of coordinate detection mark 42 acquired by CCD 53 using the inclination data of angle sensor 66. The compensation using such inclination data is especially needed when the optical axis of CCD 53 is shifted from the central axis of electronic pen 51.

The angle between optical axis of CCD 53 and central axis of electronic pen 51 is preferably within 15 degrees (DEG.). Further, within 10 degrees (DEG.) is much desirable. The compensation based on the inclination data of angle sensor 66 is performed based on the angle between optical axis of CCD 53 and central axis of electronic pen 51. At least one of bending mirror, aspheric surface mirror, or lens can be disposed on the optical path of CCD 53 so that the optical axis of CCD 53 and the central axis of the pen coincide.

The acceleration sensor 65 detects the moving speed (including acceleration) of electronic pen 51, and detects the moving direction. Use of acceleration sensor 65 enables to detect the shapes of characters, signs, and images, or vector direction and length of lines written by electronic pen 51. Acceleration sensor 65 transmits the moving direction of electronic pen 51 and acceleration data to MPU (processing circuit) 64, and MPU (processing circuit) 64 calculates the moving amount and direction of electronic pen 51 based on the moving direction data and the acceleration data.

Figure 9:
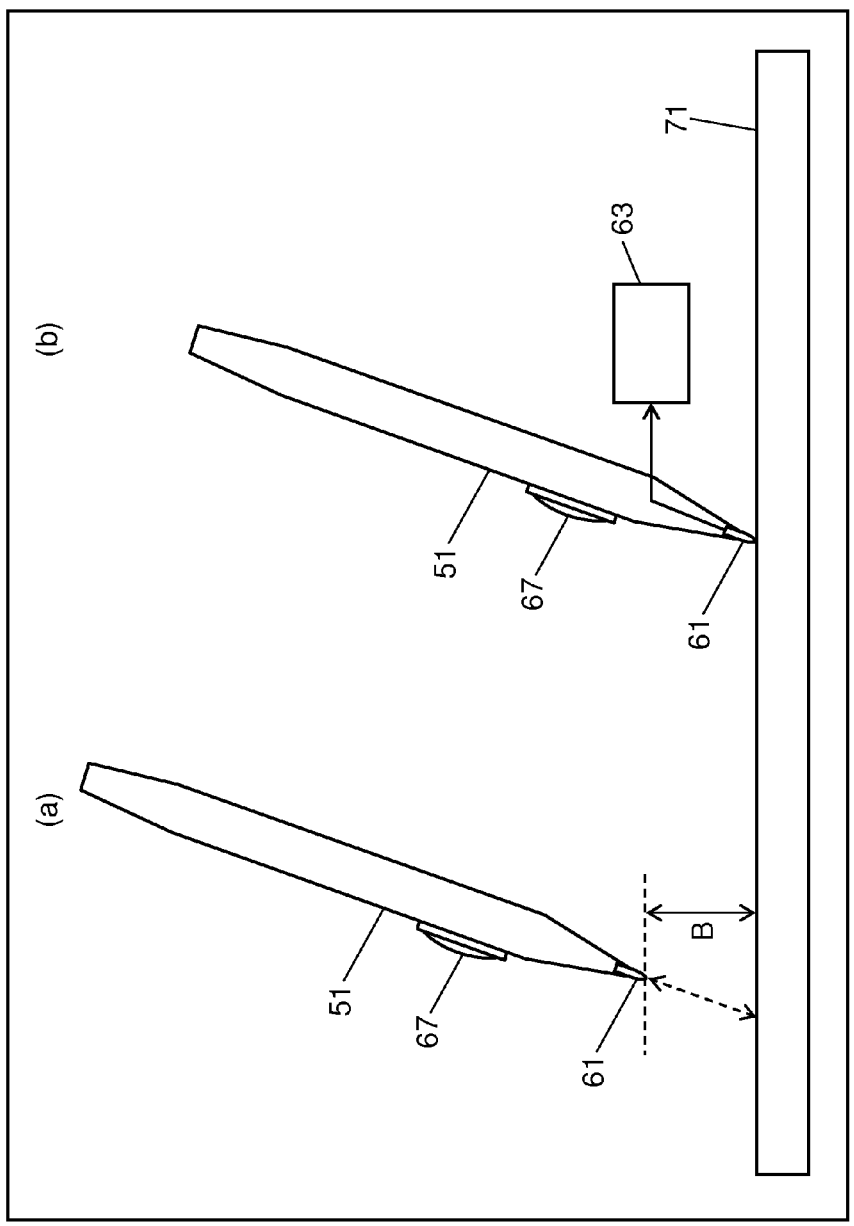
FIG. 9 illustrates an input using an electronic pen.

FIG. 9 illustrates an input using an electronic pen. FIG. (a) illustrate a distance input (hovering input), and FIG. (b) illustrates a contact input using an electronic pen.

As illustrated in FIG. (b), characters or lines are input by contacting nib 61 to EL display panel 1 and applying pressure to pressure sensor 63.

As illustrated in FIG. (a), nib 61 is not touching EL display panel 1 during the distance input. Switch 67 is pushed when performing distance input.

Display LED 69 lights up when switch 67 is pushed or the nib contacts EL display panel 1. Display LED 69 is turned ON for predetermined periods of time when power is supplied to electronic pen 51. A similar effect can be acquired by pushing switch 67 compared to touching EL display panel 1 by nib 61.

Focus depth B of condenser lens 54, disposed at a light incident surface of CCD 53, is long. F number is set preferably in the range of 8 to 20. Focus depth B is set to 20 mm or less. Therefore, coordinate detection mark 42 can be imaged in the range of focus depth B shown in FIG. 8.

When switch 67 is pushed, image of coordinate detection mark 42 inside capturing range X is readout. From the position of coordinate detection mark 42, target input position of electronic pen 51 is calculated using MPU (processing circuit) 64, and detected coordinate position Y is displayed on display screen 72.

Electronic pen 51 reads the image of coordinate detection mark 42, irrespective of distance from display screen 72, inside capturing range X in real time when the focus depth is within the range of B. Target input position of electronic pen 51 is calculated by MPU (processing circuit) 64 based on the position of coordinate detection mark 42. Detected coordinate position Y is displayed on display screen 72 as signs such as "+". Therefore, inputting position can be recognized even when the distance input is performed. When the input position coincides with signs such as "+" s or is within predetermined range, the input is completed when switch 67 is pressed.

To use two dimensional codes such as coordinate detection mark 42 efficiently, one proposed approach is to read other image information simultaneously with two dimensional codes, and then inputting the readout information to processing units, such as a computer for processing. The other known technology is to read two dimensional code symbols aligned in matrix on display screen 72 using camera while drawing on display screen 72 using electronic pen 51 to acquire coordinate information. These technologies can be combined to present disclosure.

Tablet terminal 71 of FIG. 7, which is an example of information display apparatus, has memory and MPU (processing circuit) 75. Hand-write information accepted by information input means is memorized to memory by MPU (processing circuit) 75 relatively to identified information recognized by electronic pen 51. The example of the memory is large capacity flash memory or hard disk drive.

The information display apparatus of this embodiment mainly assumes a mobile use and a use at arbitrary places. For this reason, a rechargeable secondary battery built inside the main body is desirable for a main power supply. Considering the power consumption of the main power supply, electronic pen 51 is operable when main power supply is launched. Such function is executed by a power supply launching means under a control of MPU (processing circuit) 75.

An image capturing apparatus is configured by image sensors, such as condenser lens 54, CCD 53, and CMOS (not shown); and a controller controlling the image sensor. The image inside capturing range X is photoed to output a monochrome image of 8 bits. The number of pixels of CCD 53 should be QVGA or CIF size for example.

MPU (processing circuit) 64 adjusts the capturing timing, shutter speed, and gain of CCD 53, so that an image having whiteout conditions or blocked up shadows are not photoed. The image photoed by CCD 53 is inputted to a dot detector, detects the dots in the image, and outputs an dot image which express the dots as black pixels and others as white pixels. The dot image is input to a code frame detector for detecting a frame of two dimensional codes. The code frame detector outputs the coordinate (code position information) of the detected frame and the dot image. The code position information and the dot image are inputted to a data acquisition unit. The data acquisition unit acquires code data of "1" or "0" based on an existence of dot inside the code frame, and then aligns the data. An error correction unit corrects error of the acquired data. When the data has no error or error correction is possible, error correction judgment information is outputted as "proper", and the corrected data is outputted. When the data is uncorrectable, the error correction judgment information is outputted as "improper", and the data without correction is outputted. A data decoding unit decodes coordinate information from the corrected data.

Figure 10:
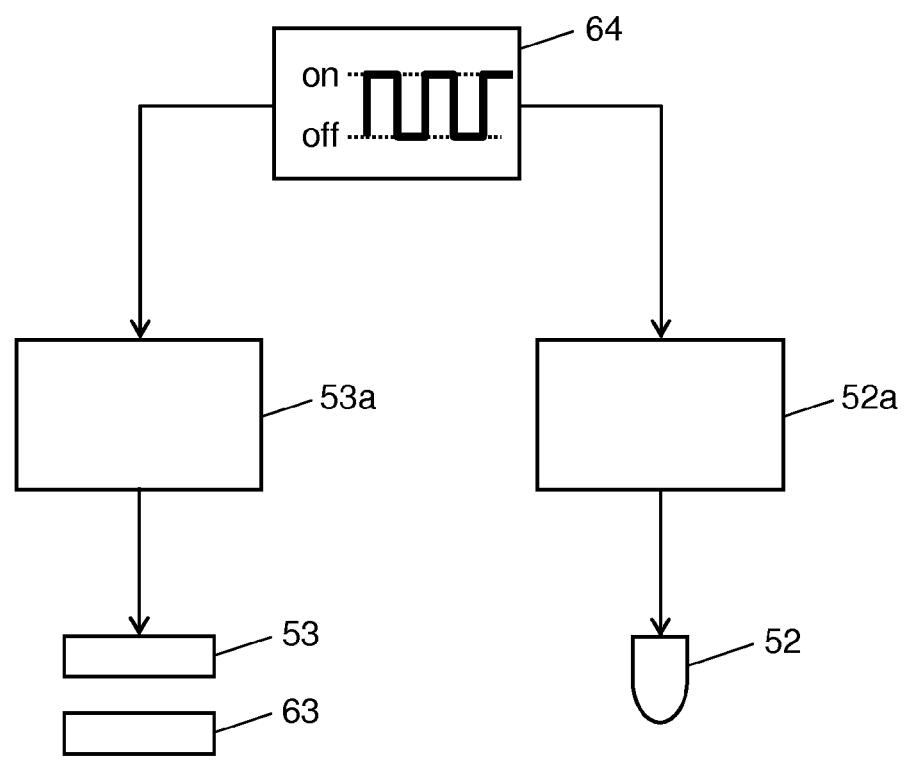
FIG. 10 illustrates a control method of LED and CCD.

FIG. 10 illustrates a controlling method of LED and CCD. MPU (processing circuit) 64 outputs a control signal for turning CCD 53 on and off, and a control signal of LED 52 synchronized with the signal. Based on these control signals, driving circuit 53a of CCD 53 and IR-LED driving circuit 52a of LED 52 are controlled.

CCD driving circuit 53a and LED driving circuit 52a control CCD 53 and LED 52 based on control signals. LED 52 is turned on while CCD 53 is capturing an image (during exposure). LED 52 is turned off when CCD 53 is not capturing an image (when not exposure). At least when CCD 53 is capturing an image, LED 52 is turned on.

The example discussed in FIG. 7 relates to electronic pen 51 employing LED 52 in the casing of electronic pen 51. However, when both of LED 52 and CCD 53 are disposed inside the cabinet of electronic pen 51, it is sometimes difficult to align the optical axis of CCD 53 with the central axis of electronic pen 51. Further, size of electronic pen 51 becomes larger when both LED 52 and CCD 53 are accommodated in electronic pen 51.

Figure 11:
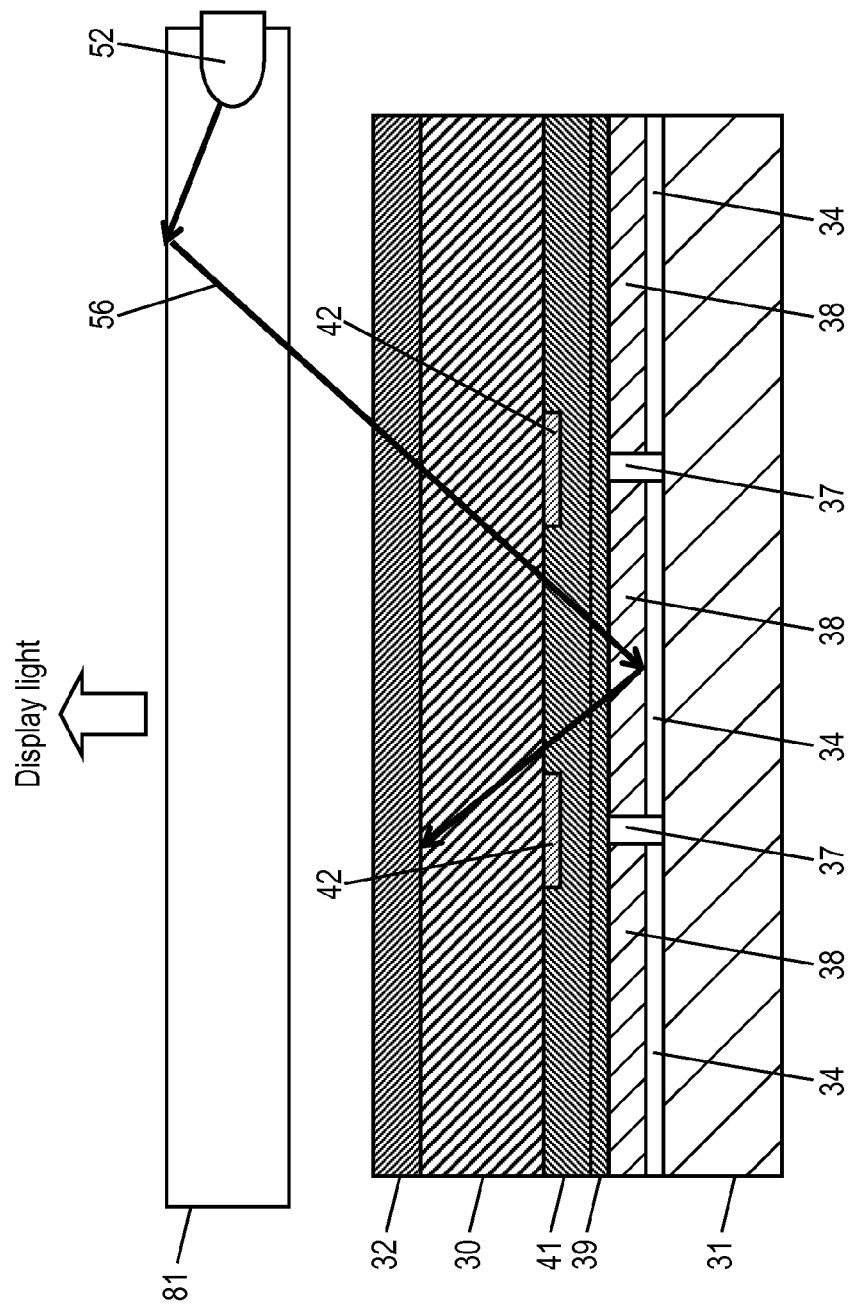
FIG. 11 illustrates another example of an information display apparatus employing an EL display device according to an exemplary embodiment.

The example of FIG. 11 equips CCD 53 only in electronic pen 51, and disposes LED 52 in EL display panel 1. Protective cover 81 accommodates LED 52, and is disposed on the display surface side of EL display panel 1. Since only CCD 53 is disposed inside the casing of electronic pen 51, the optical axis of CCD 53 can be easily coincided with the central axis of electronic pen 51. Further, since only CCD 53 is disposed inside electronic pen 51, the pen 51 can be down-sized and can thinner its thickness.

As illustrated in FIG. 11, infrared rays 56 emitted from LED 52 spread throughout display screen 72 of EL display panel 1 using protective cover 81 etc. The spread infrared rays 56 penetrate polarizing plate 32, then enter reflective film 40 and coordinate detection mark 42 etc.

Infrared rays 56 which entered coordinate detection mark 42 scatter and again transmit polarizing plate 32 to enter CCD 53 of electronic pen 51. LED 52 and CCD 53 are synchronized using the circuit system of FIG. 10.

Figure 12:
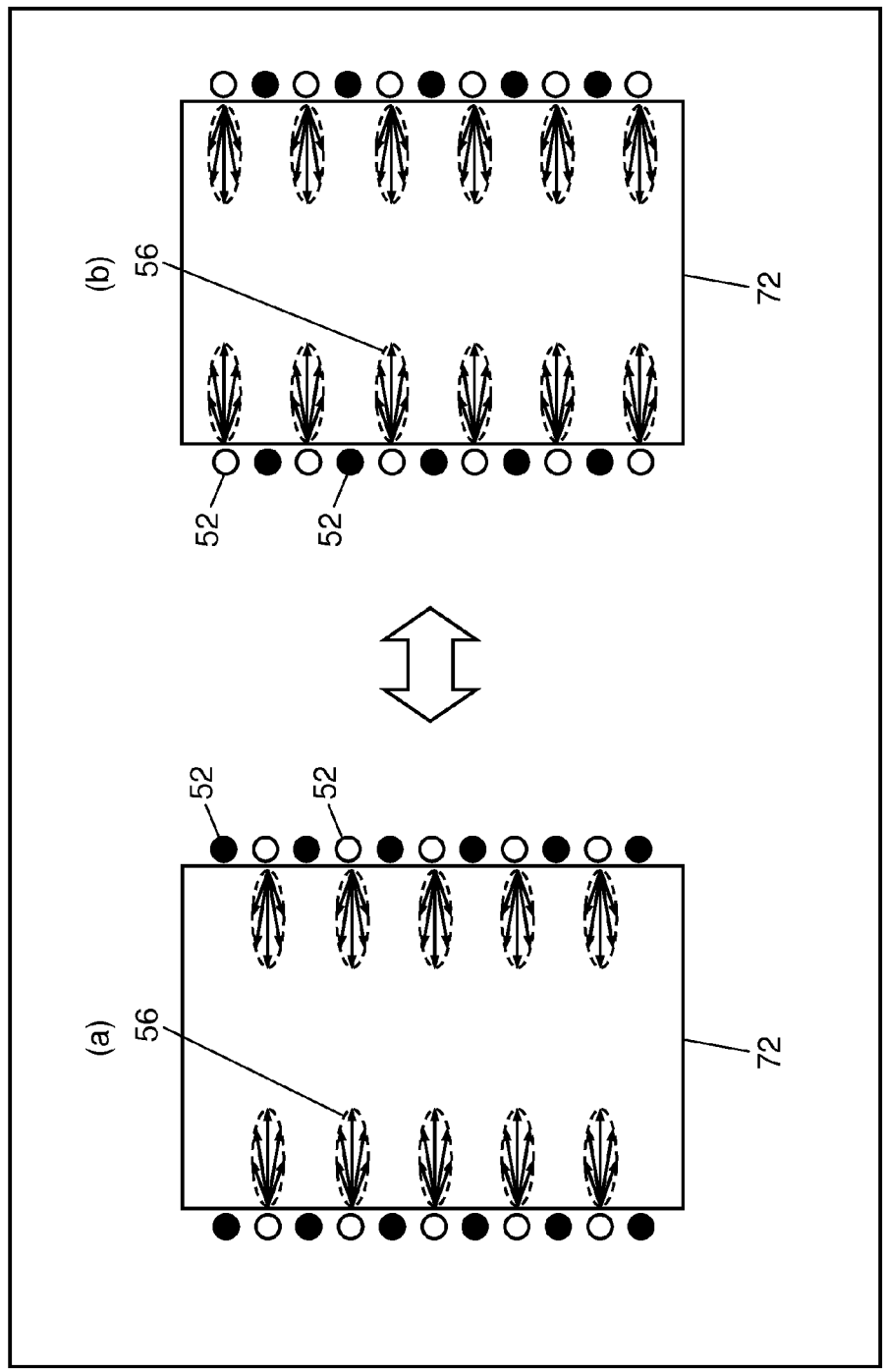
FIG. 12 illustrates a state where LEDs are attached to substrate, and a state of lighting control of LED.

FIG. 12 illustrates an attachment state of LED to the substrate of LED, and lighting controlling state of LED. The substrate corresponds to protective cover 81, seal board 30, and array substrate 31. However, the substrates can have other structure if the substrate can spread infrared rays 56 emitted from LED 52.

As illustrated in FIG. 12, LED 52 is attached or disposed at least in the both side of substrate. LED 52 can be attached on all four sides of the substrate. In FIG. 12 and other figures, a black circle indicates LED 52 which is turned off, and a white circle indicates LED 52 which is turned on.

The statuses shown in (a) and (b) of FIG. 12 are alternatively repeated. Lighting of LED 52 can be controlled based on the position of electronic pen 51.

Figure 13:
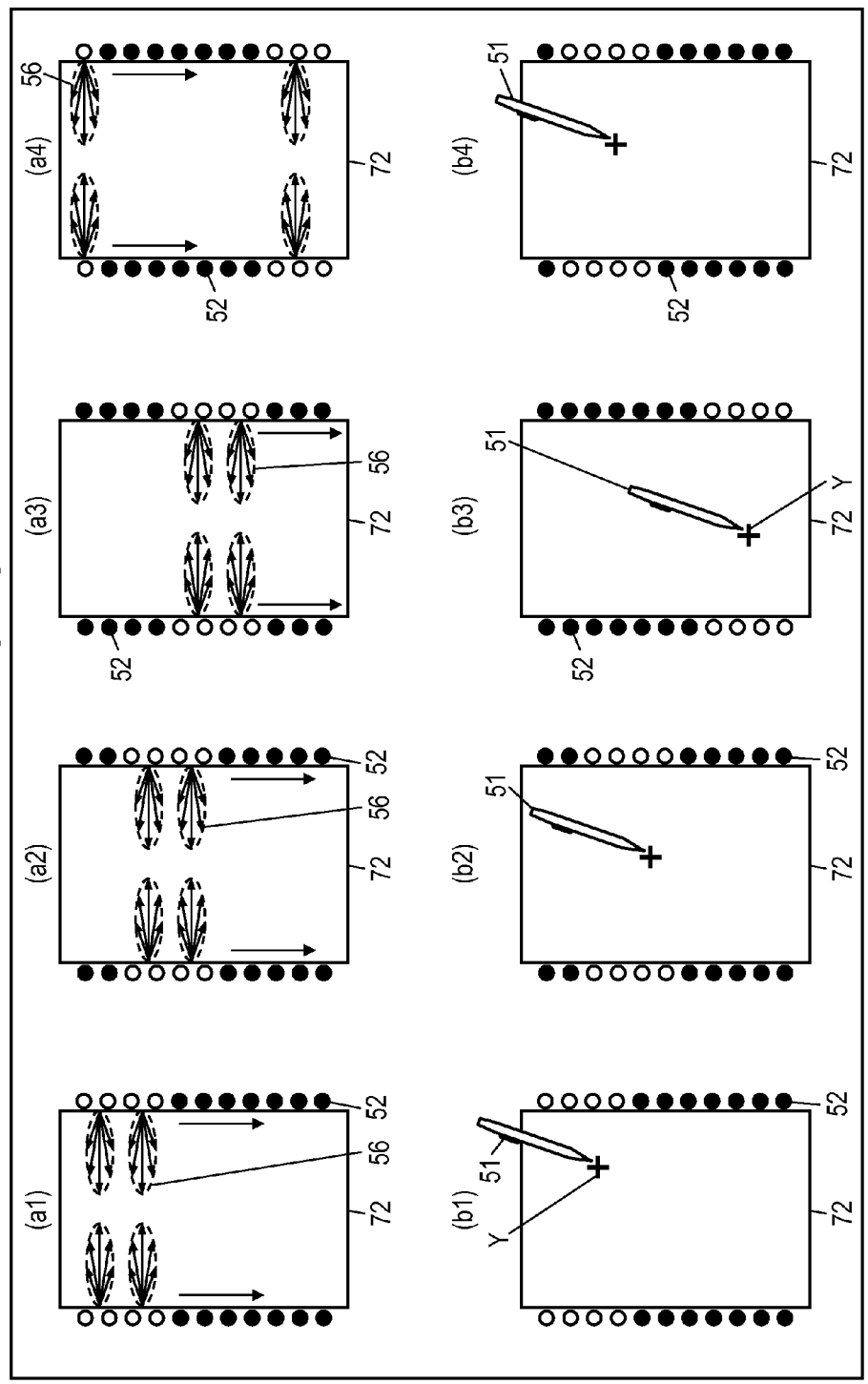
FIG. 13 illustrates a state where LEDs are attached to substrate, and a state of lighting control of LED.

In the configuration (a1) to (a4) of FIG. 13 illustrate scanning examples of lighting position of LED 52 in the vertical and horizontal direction of the display screen. The electric power consumed in LED 52 can be reduced by scanning. Scanning direction and velocity are desirable to be changed based on the position of electronic pen 51.

In the configuration (b1) to (b4) of FIG. 13 illustrate a method for changing the lighting position of LED 52 based on position Y detected by electronic pen 51. Position of electronic pen 51 is detected or estimated first and then LED 52 corresponding to the detected or estimated position or on its neighborhood is turned on. Different LEDs 52 turn on depending on the position of the nib of electronic pen 51. As a result of the above discussed control, power consumption of LED 52 is reduced and the coordinate is detected accurately.

Figure 14:
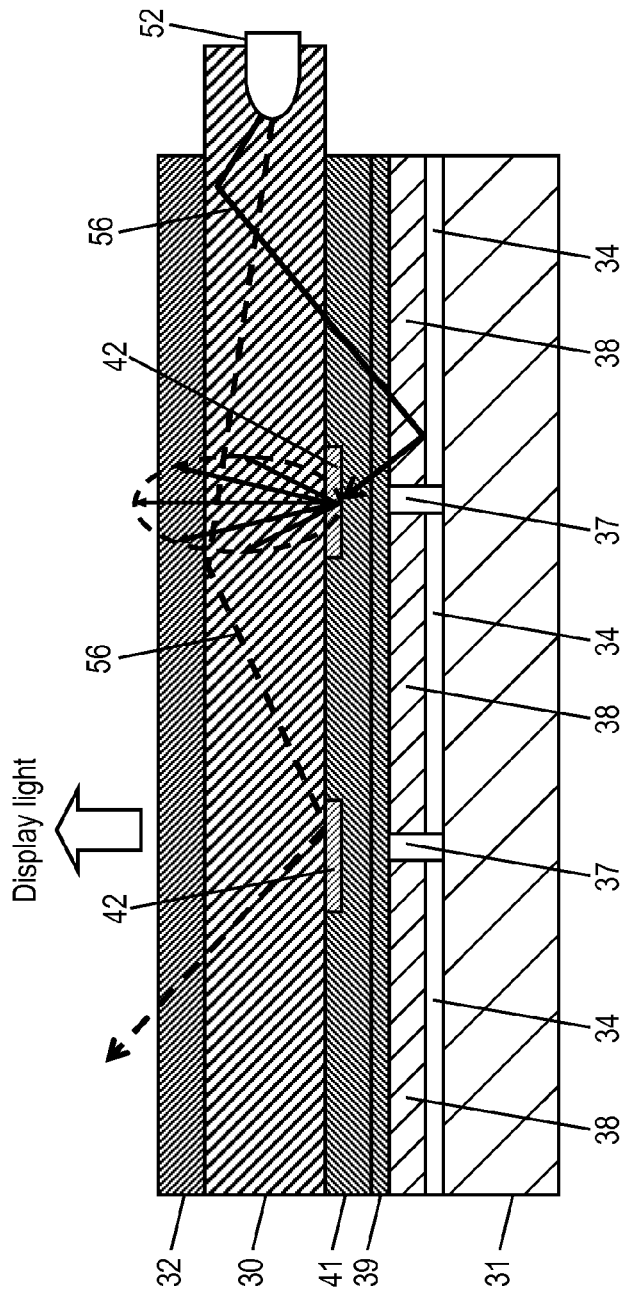
FIG. 14 illustrates another example of an information display apparatus employing an EL display device according to an exemplary embodiment.

In the example of FIG. 14, LED 52 is attached to seal board 30. Infrared rays 56 emitted from LED 52 spread throughout display screen 72 of EL display panel 1 by seal board 30. Since seal board 30 is disposed at the display layer side of polarizing plate 32, light is not decreased by polarizing plate 32 compared to the example of FIG. 11 where LED 52 is disposed outside polarizing plate 32. Therefore, infrared rays 56 of LED 52 can be used efficiently.

Infrared rays 56 spread through seal board 30 etc., and then enter reflective film 40 or coordinate detection mark 42 while some of the rays reflect.

Infrared rays 56 which entered coordinate detection mark 42 scatter or reflect, and then transmit polarizing plate 32 again to enter CCD 53 of electronic pen 51. LED 52 and CCD 53 are synchronized by the circuit system of FIG. 10, for example. They can be driven similarly to the method of FIGS. 12 and 13.

Figure 15:
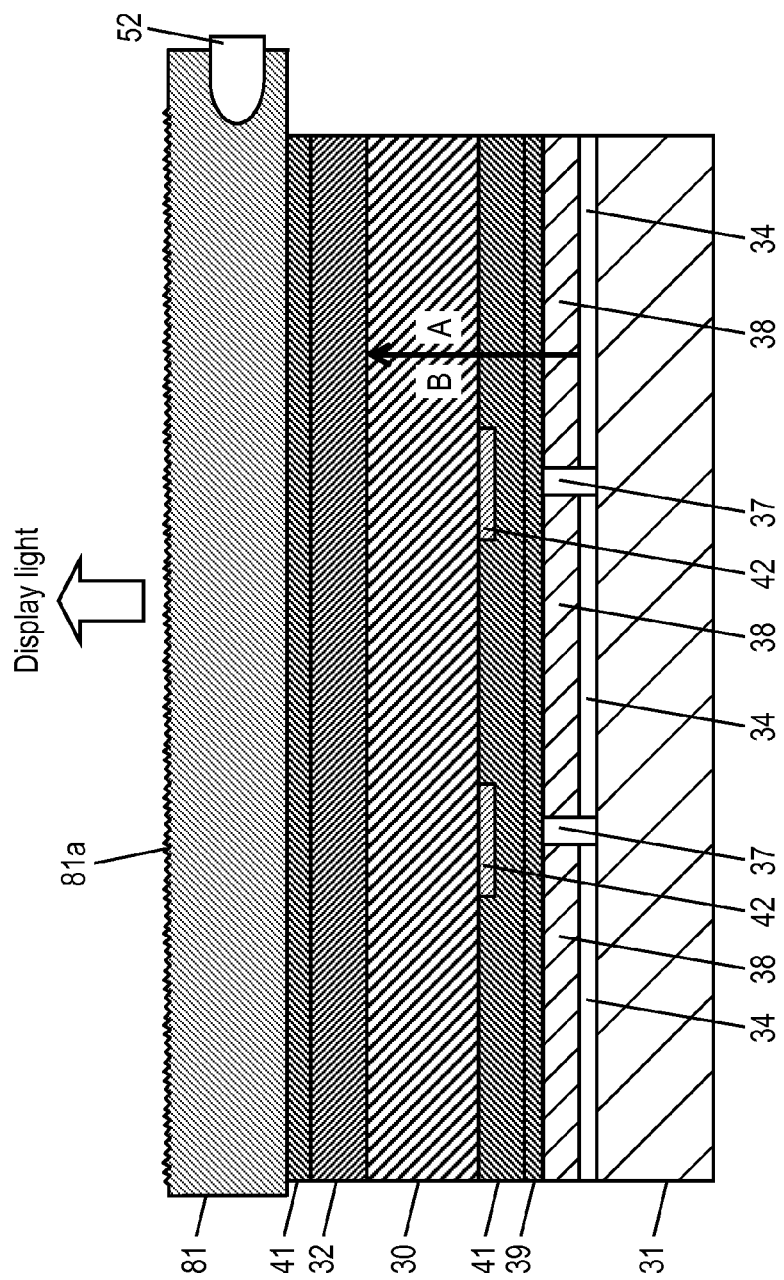
FIG. 15 illustrates another example of an information display apparatus employing an EL display device according to an exemplary embodiment.

Example of FIG. 15 regards to a structure where LED 52 is attached to protective cover 81, and rough surface fabrication 81a is executed to the surface of protective cover 81. Rough surface fabrication 81a is a structure at which unevenness is formed on the surface of protective cover 81 by mechanical or chemical processing. According to rough surface fabrication 81a, a user can feel friction when nib 61 or tip lens 55 contacts rough surface fabrication 81a of a display panel. If the surface is not fabricated as rough surface fabrication 81a, the user might feel uncomfortable when writing because nib 61 is slippery. Rough surface fabrication 81a is not limited to a fabrication or a processing which are directly executed to protective cover 81, seal board 30, or array substrate 31. For example, substrate or sheet formed rough surface or unevenness can be adhered to the substrate.

Figure 16:
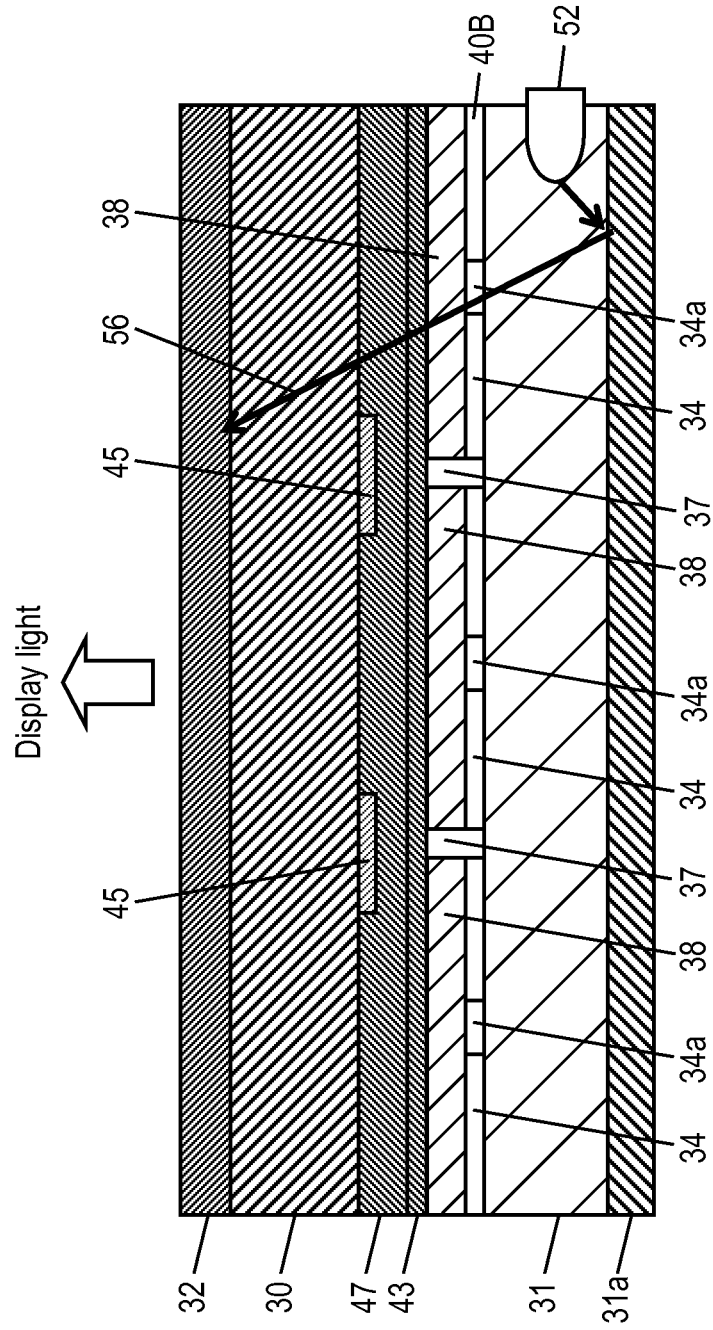
FIG. 16 illustrates another example of an information display apparatus employing an EL display device according to an exemplary embodiment.

In the example of FIG. 16, LED 52 is attached to array substrate 31. Infrared rays 56 emitted from LED 52 are reflected or scattered at array substrate 31 or reflective film 31a, and then spread throughout display screen 72 of EL display panel 1. Since array substrate 31 is disposed at the lower layer side of polarizing plate 32, light is not decreased by polarizing plate 32 compared to the example of FIG. 11 where LED 52 is disposed outside polarizing plate 32. Therefore, infrared rays 56 of LED 52 can be used efficiently. Reflective film 31a can be made of an optical diffusion material which scatters light.

As illustrated in FIG. 16, the transmitted infrared rays 56 pass through passage hole 34a (non-reflecting domain) formed in anode electrode 34, and transmit to seal board 30 side. Infrared rays 56 scatter or reflect at coordinate detection mark 42. Then penetrate polarizing plate 32 again, and enter into CCD 53 of electronic pen 51. Driving method is similar to that of the example discussed above.

In the examples of FIGS. 14 to 16, substrate for transmitting light from LED 52 is provided in the lower layer of polarizing plate 32, or light from LED 52 is transmitted or emitted in the lower layer of polarizing plate 32. In this case, coordinate detection mark 42 does not have to be a light scattering material that disarranges circular polarized lights or polarization state. For example, coordinate detection mark 42 can have light reflecting structure. This is because since light having a color close to natural light is irradiated to coordinate detection mark 42 from LED 52, the light entering coordinate detection mark 42 can penetrate polarizing plate 32.

FIGS. 17 to 26 illustrate the examples of arrangement of coordinate detection marks.

Figure 17:
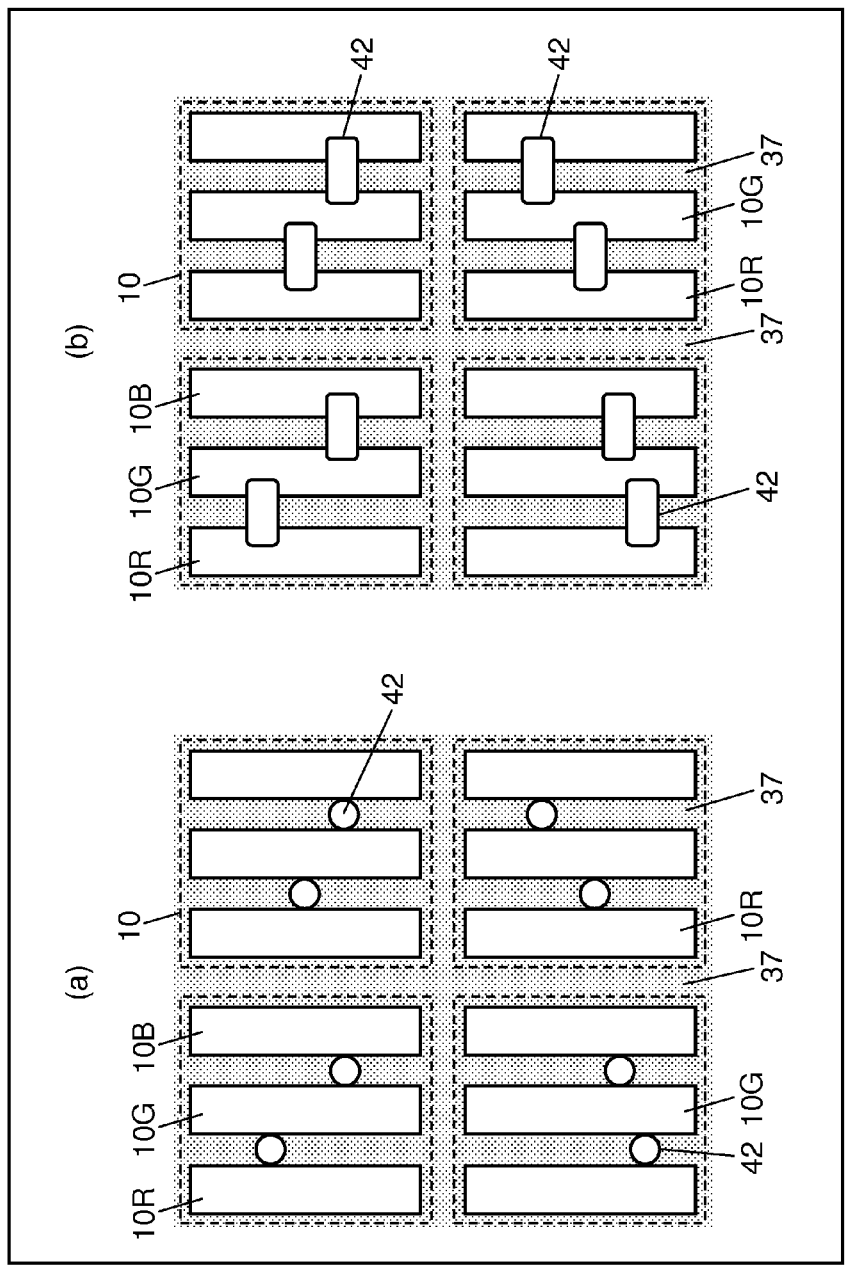
FIG. 17 illustrates an example of a layout of coordinate detection marks.

In the configuration (a) of FIG. 17, coordinate detection marks 42 are formed in shape of dots, so that the whole mark 42 or portion of the mark overlaps rib 37. Coordinate detection marks 42 are disposed so that position of each of the marks can be specified from an image of the mark 42 captured by CCD 53 based on mathematics or coding theory.

In the configuration (b) of FIG. 17, coordinate detection marks 42 are formed in rectangle or ellipse shape, and are disposed so that the whole mark 42 or portion of the mark overlaps the rib 37 or anode electrode working as an image electrode. Coordinate detection marks 42 are disposed so that position of each of the marks can be specified from captured image of the mark 42 by CCD 53. Since coordinate detection marks 42 are formed on rib 37, image electrode is not shaded by coordinate detection marks 42, and can display images having high brightness.

Figure 18:
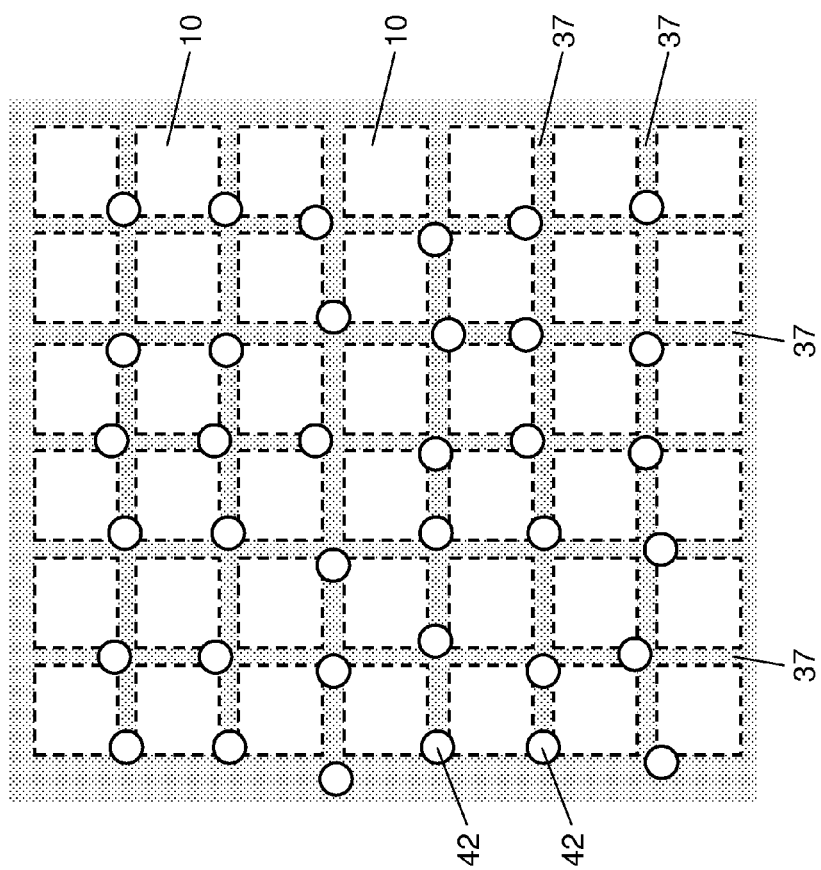
FIG. 18 illustrates an example of a layout of coordinate detection marks.

As illustrated in FIG. 18, coordinate detection marks 42 are formed on intersections of pixels or in the neighbor of the intersections. Basically, one coordinate detection mark 42 is formed for one pixel 10 or for a group of pixels consisting RGB pixels.

Figure 19:
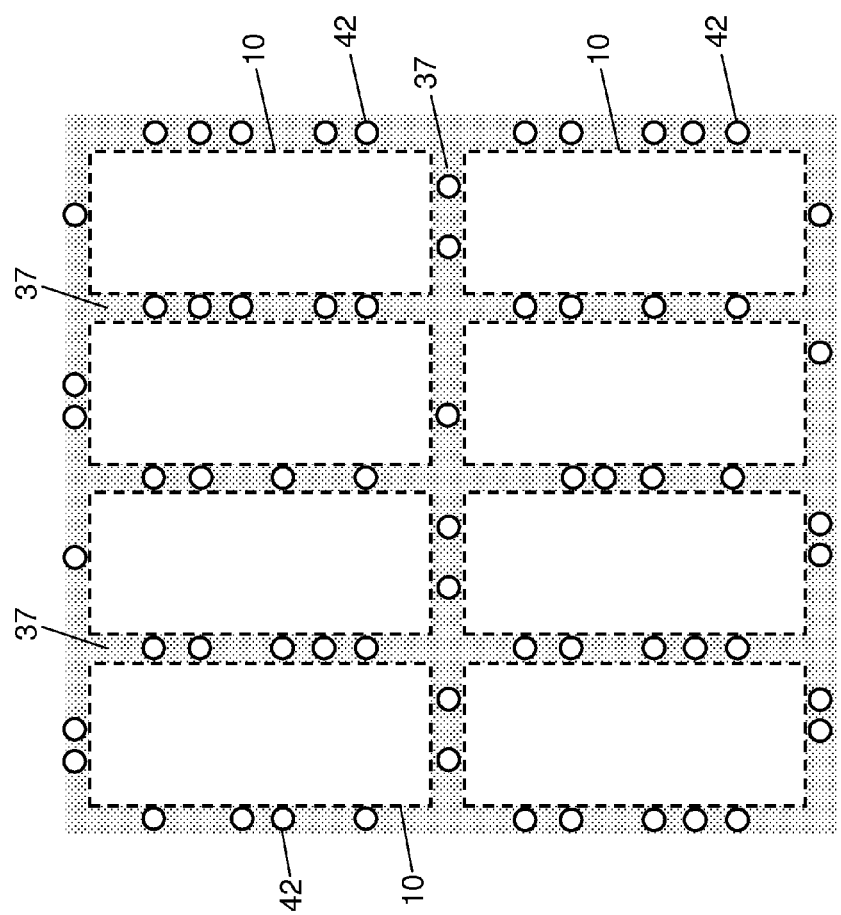
FIG. 19 illustrates an example of a layout of coordinate detection marks.

FIG. 19 illustrates an example where multiple coordinate detection marks 42 are formed for one pixel. Coordinate position is described based on the number, interval, and position of coordinate detection marks 42.

Figure 20:
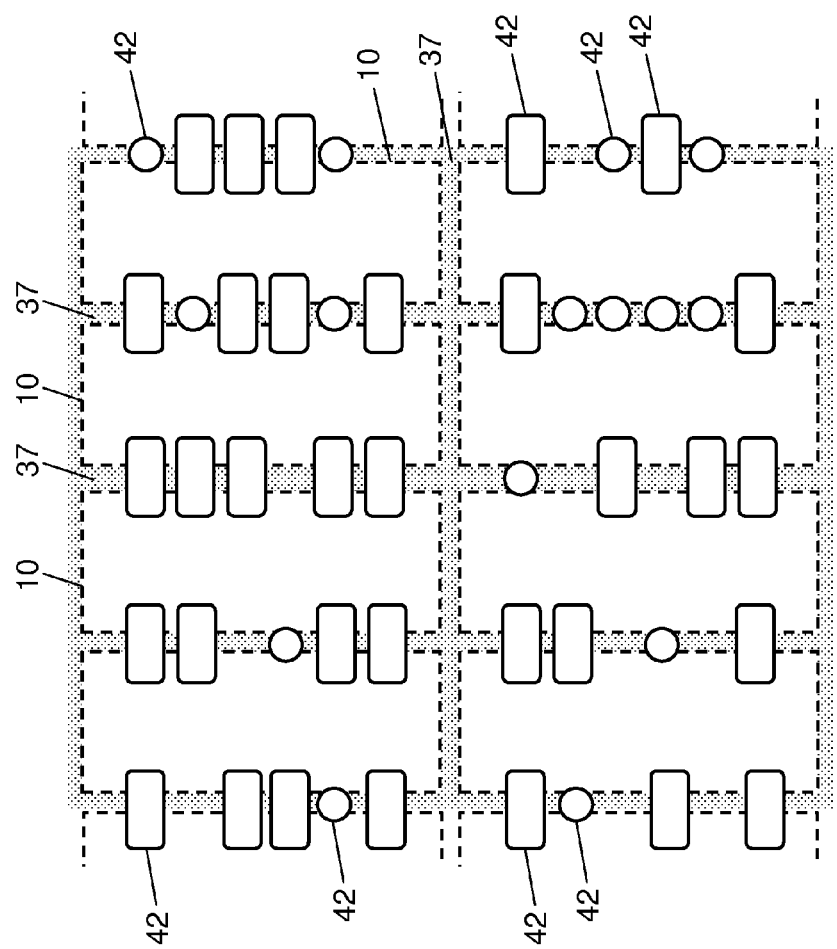
FIG. 20 illustrates an example of a layout of coordinate detection marks.

In an example of FIG. 20, several types of coordinate detection marks 42 having different shapes, e.g. circle, rectangle, or ellipse are disposed. The marks 42 are formed so that the whole mark or portion of the mark overlaps rib 37. Coordinate detection marks 42 are disposed so that position of each of the marks can be specified from an image of the mark 42 captured by CCD 53.

Figure 21:
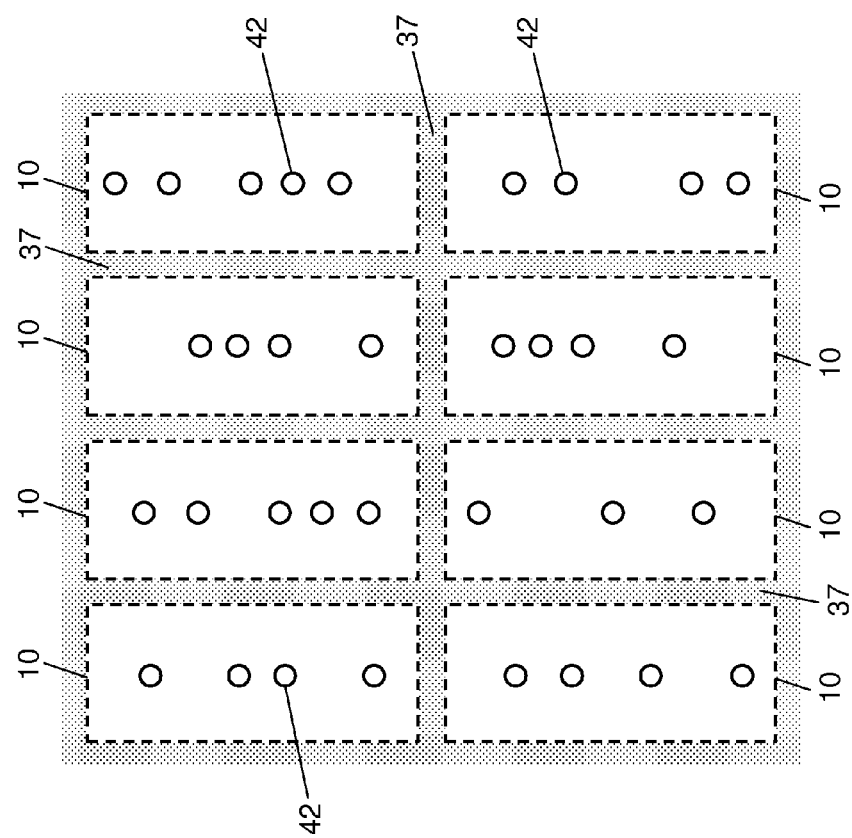
FIG. 21 illustrates an example of a layout of coordinate detection marks.

FIG. 21 illustrates an example where multiple coordinate detection marks 42 are formed on one pixel electrode. Coordinate position is described based on the number, interval, and position of coordinate detection marks 42.

Figure 22:
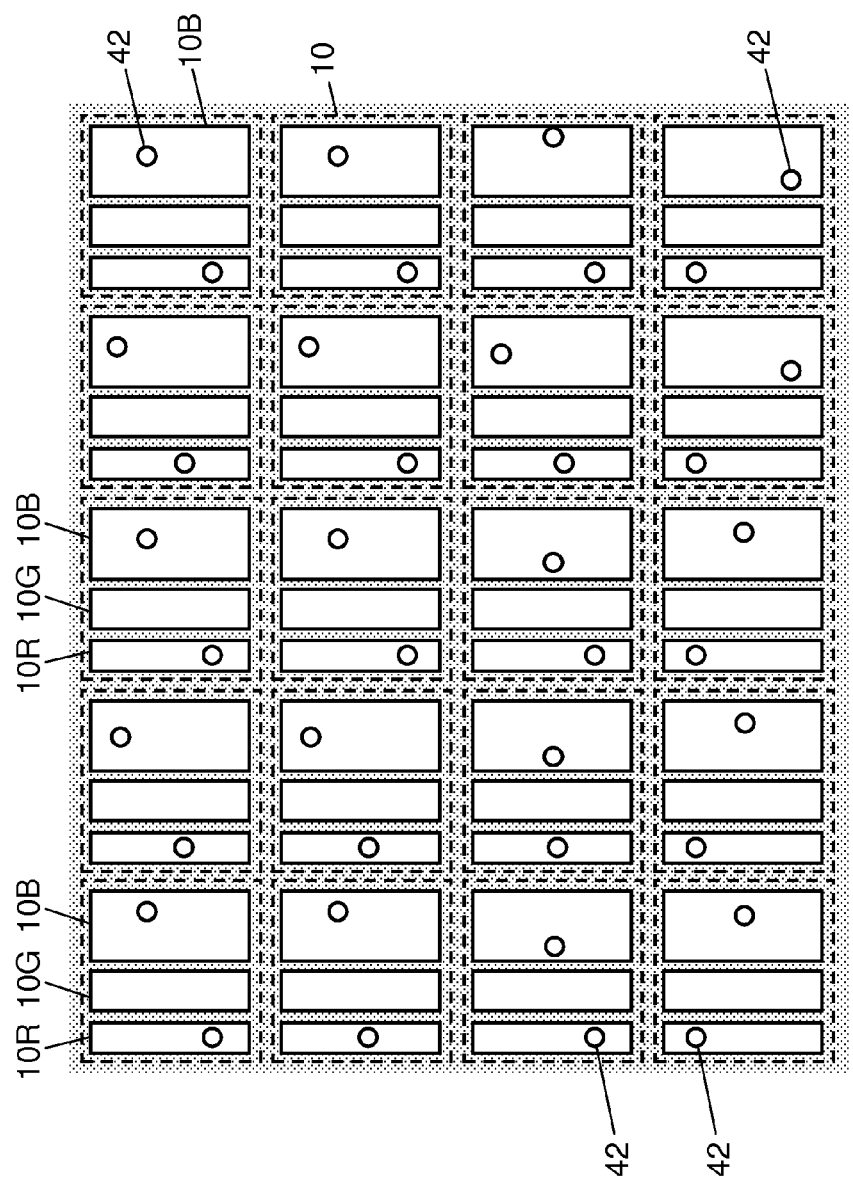
FIG. 22 illustrates an example of a layout of coordinate detection marks.

FIG. 22 illustrates an example where coordinate detection marks 42 are formed on some of the pixel electrodes. Coordinates detection marks 42 are formed on red pixels 10R and blue pixels 10B. However, the marks 42 are not formed on green pixels 10G.

Figure 23:
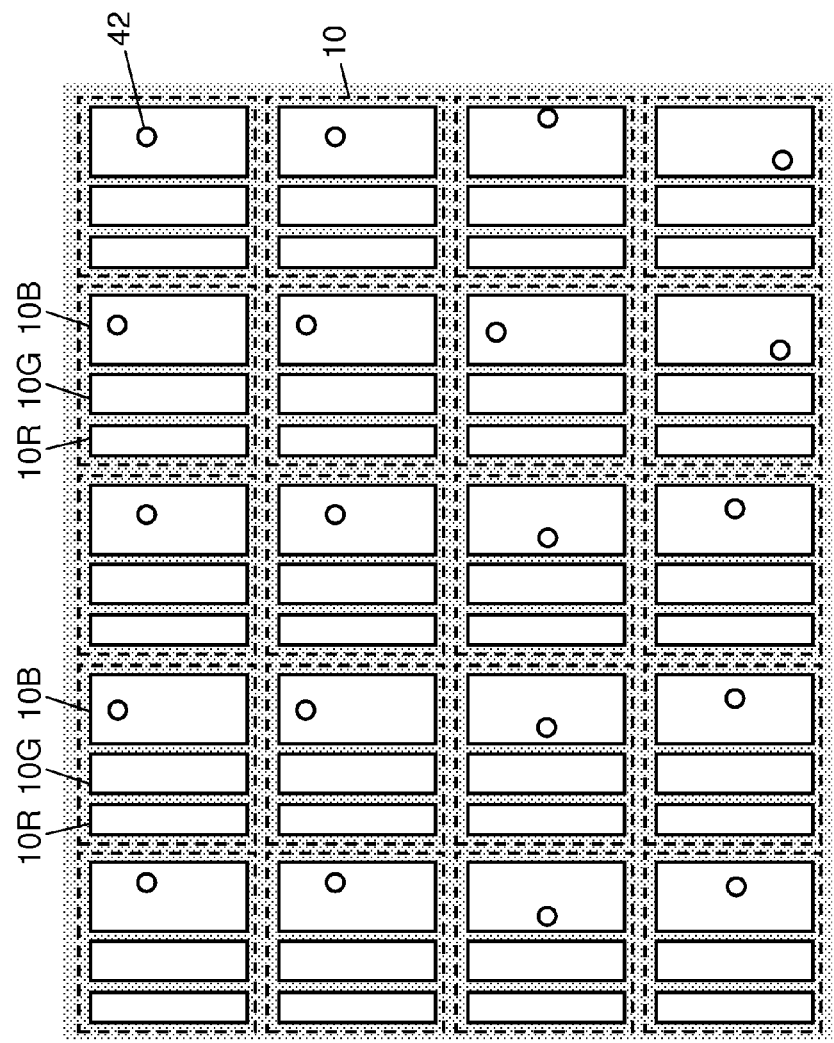
FIG. 23 illustrates an example of a layout of coordinate detection marks.

FIG. 23 illustrates an example where coordinate detection marks 42 are formed on blue pixels 10B. The marks 42 are formed on blue pixels 10B, but not on red pixels 10R and green pixels 10G.

Figure 24:
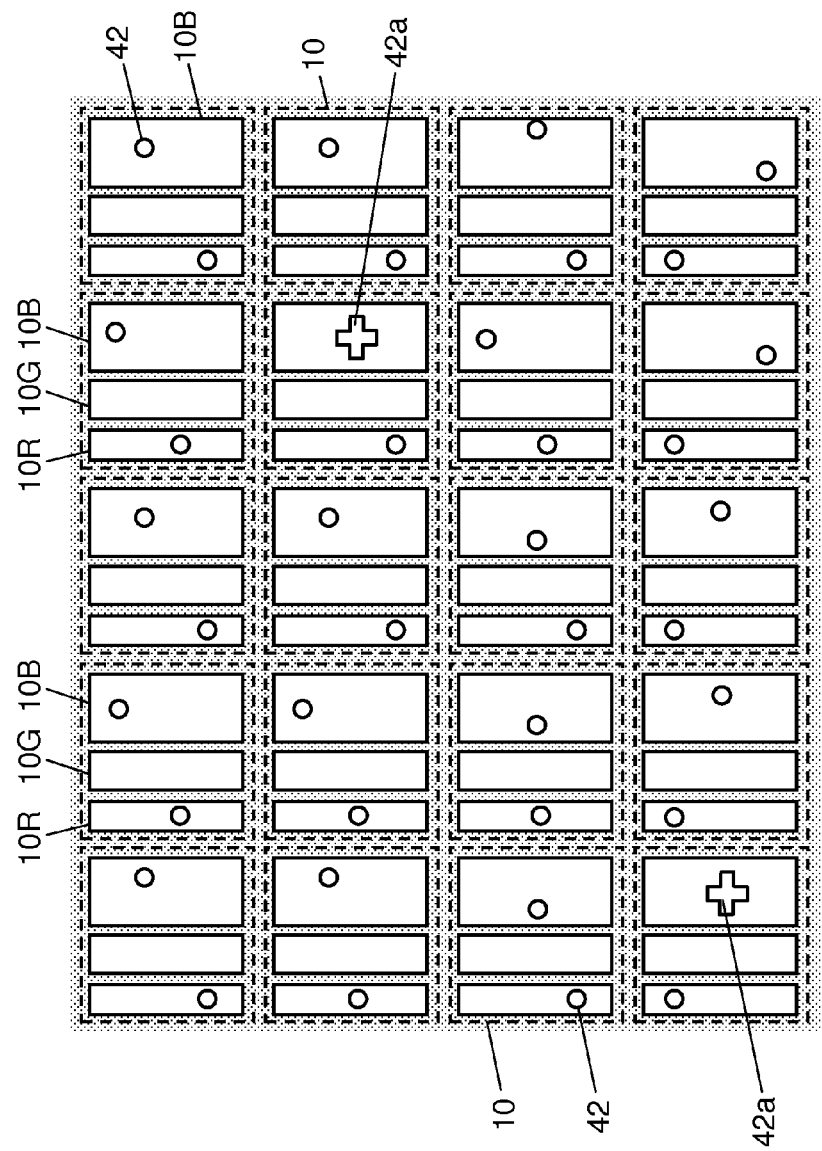
FIG. 24 illustrates an example of a layout of coordinate detection marks.
Figure 25:
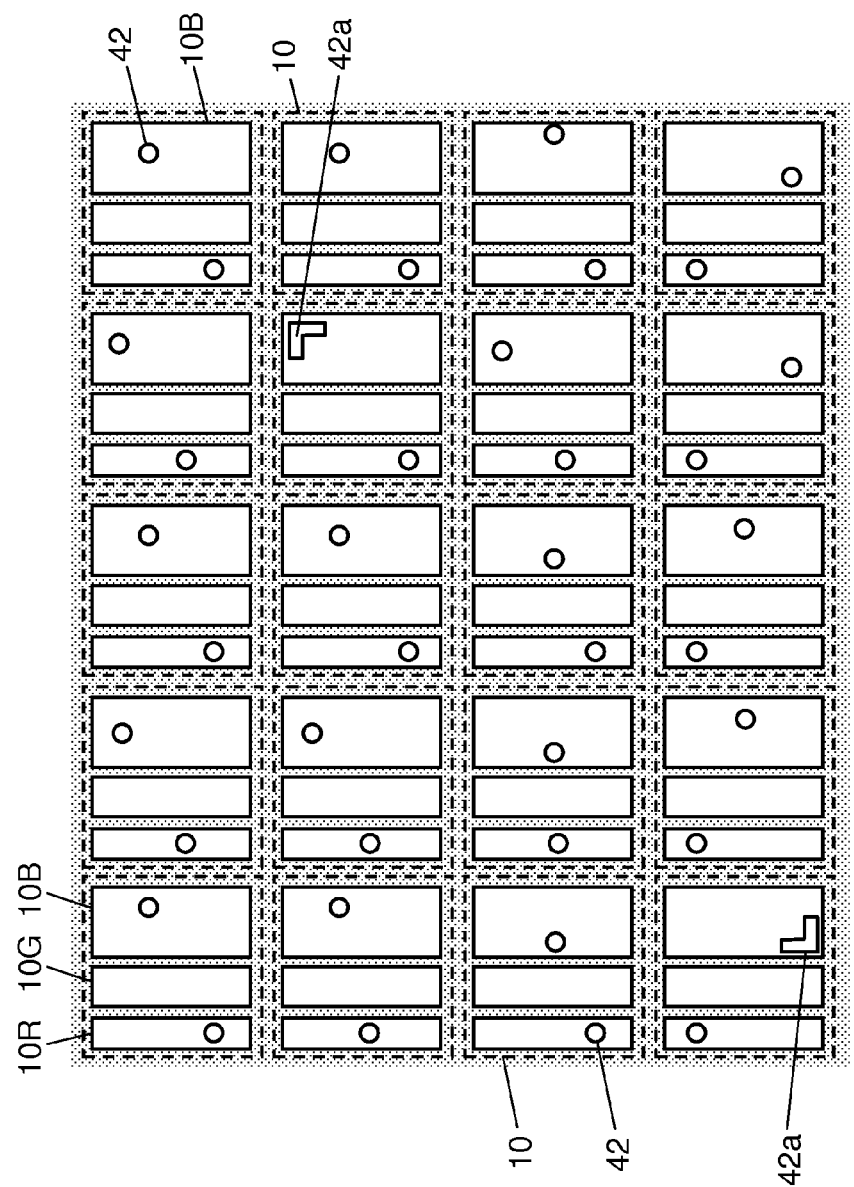
FIG. 25 illustrates an example of a layout of coordinate detection marks.

FIGS. 24 and 25 illustrate examples where position adjustment marks 42a are further formed on the structure of FIG. 22. Position adjustment mark 42a can be used also as coordinate detection mark 42. When position adjustment mark 42a is read using electronic pen 51, an approximate coordinate position in EL display panel 1 can be detected. Coordinates detection mark 42 and position adjustment mark 42a are desirably formed on different position.

Figure 26:
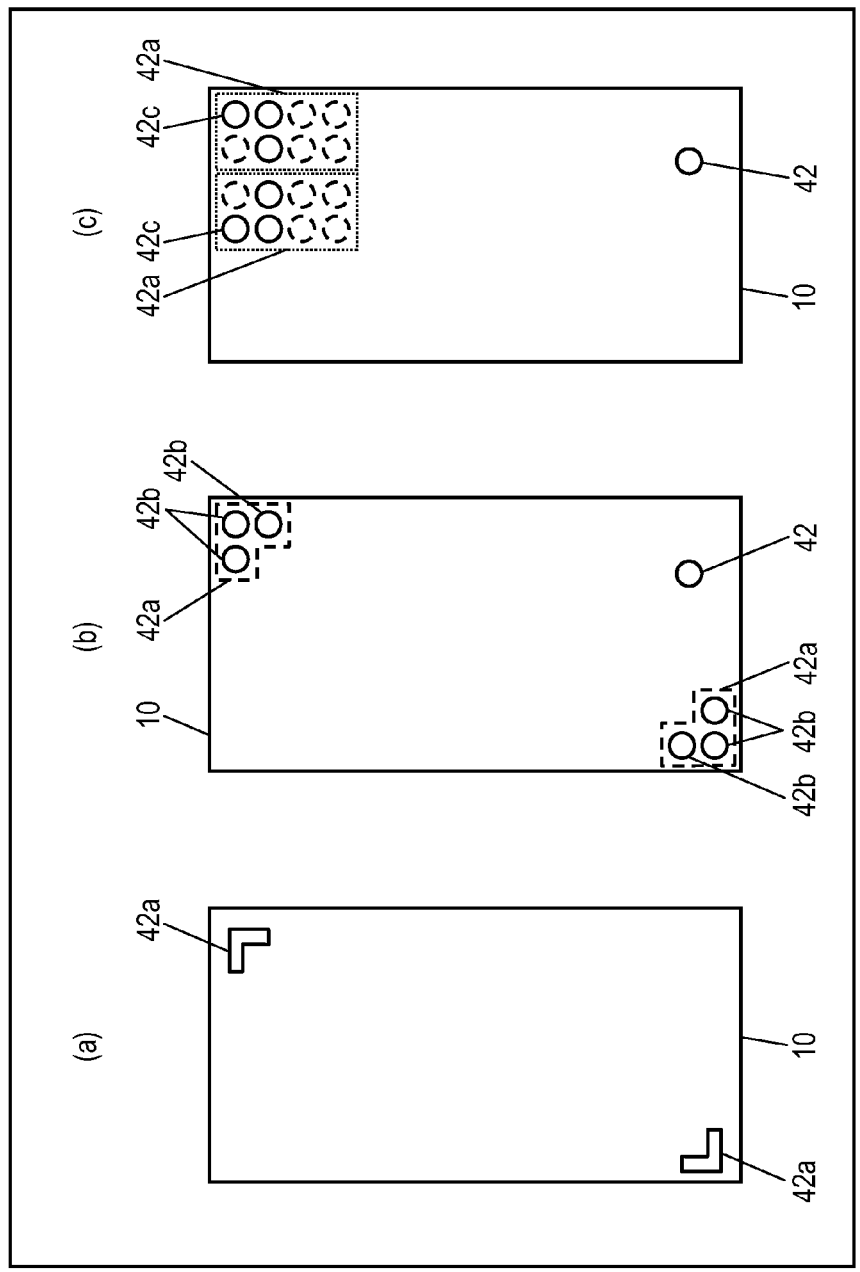
FIG. 26 illustrates an example of a layout of coordinate detection marks.

FIG. 26 illustrates modified examples of position adjustment marks 42a. Configuration (a) shows an example where two position adjustment marks 42a are formed in one pixel. Configuration (b) shows position adjustment mark 42a formed by combination of multiple coordinate detection marks 42b. Configuration (c) shows an example where a set of coordinate detection marks 42c are formed inside one position adjustment mark 42a. In this example, position adjustment mark 42a is expressed by Braille characters.

Figure 27:
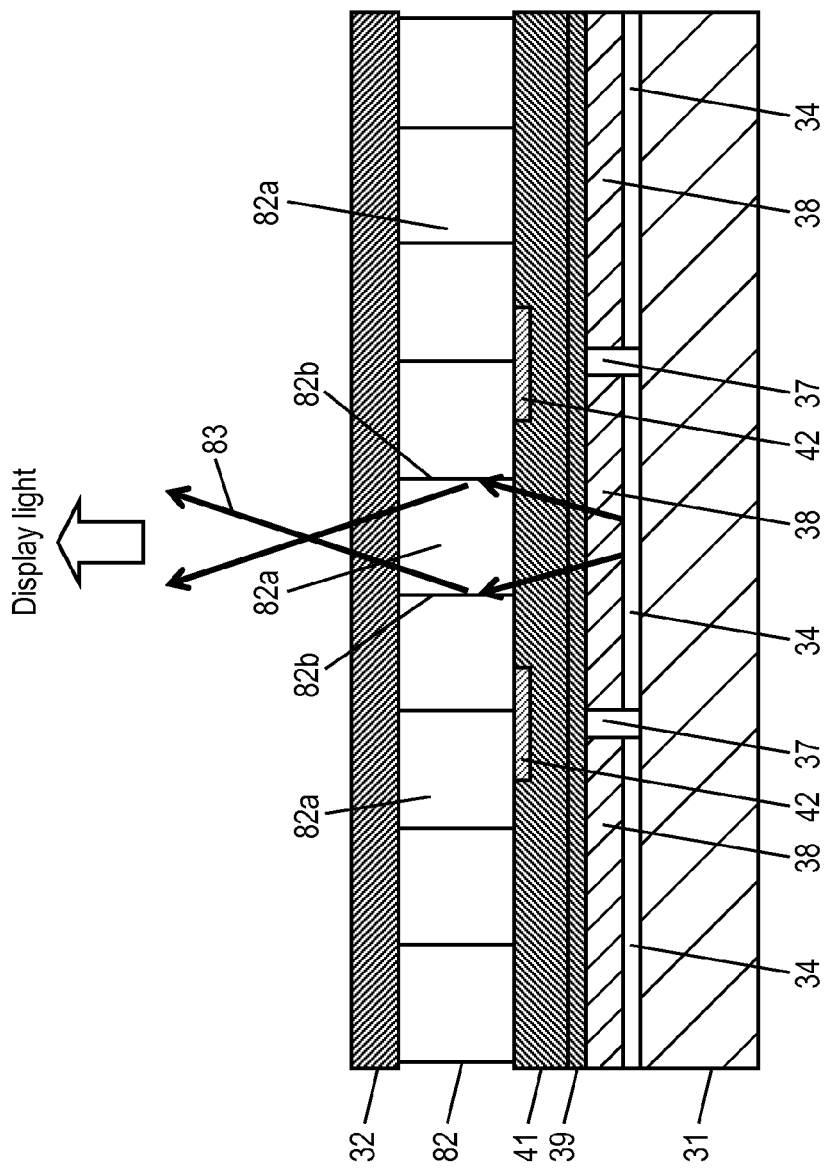
FIG. 27 illustrates another example of an information display apparatus employing an EL display device according to an exemplary embodiment.

FIG. 27 is a schematic sectional view illustrating other example of EL display panel of information display apparatus according to one embodiment.

When an input is made by electronic pen 51 to EL display panel 1, azimuth should be considered. Azimuth occurs because polarizing plate 32 etc. is disposed on the display area of EL display panel 1. When the nib of electronic pen 51 is located on polarizing plate 32, while an image is displayed on the luminescence part of EL display panel 1, azimuth occurs between the nib of the pen and the displayed image.

Therefore, in the EL display panel 1 of this embodiment, fiber plate 82 is adhered to cathode electrode by adhesive layer 41, and is disposed between polarizing plate 32 and coordinate detection mark 42 to reduce the azimuth. Fiber plate 82 is made by aligning multiple fibers 82a having calibers smaller than pixel 10. Reflective film 82b is formed in the circumference of fiber 82a, and the film 82b has a refractive index different from fiber 82a. Display light 83 entering fiber 82a, is thereby reflected and transmitted to be emitted from EL display panel 1.

As discussed above, according to the information display apparatus of one embodiment, in EL display panel 1 having display area 2 where pixels 10 of EL elements 12 are arranged in matrix, polarizing plate 32 polarizing incidence light is being disposed, and the panel 1 further has characteristics that can change the direction of light incident to the panel 1 by employing coordinate detection mark 42 made of light scattering component or diffraction grating that can change polarization state determined by the polarizing plate. When electronic pen 51 is employed (where the pen 51 comprises optical generation means, such as LED 52 emitting light, e.g. infrared rays for detecting the coordinate detection mark, and image acquisition means, such as CCD 53 capturing the image of predetermined range including coordinate detection mark 42), the coordinates position can be easily specified by detecting the light transmitted or reflected coordinate detection mark 42 using the image acquisition means, such as CCD 53.

The above discussed embodiment can be applied easily in an EL display device. Therefore, the present disclosure is applicable to video camera, digital camera, goggle display, navigation system, sound reproducing device (car audio, audio component stereo), computer, game machine, PDA (Personal Digital Assistant), and an apparatus which read-outs a recorded media and displaying the image, e.g. display apparatus equipped with recording media.

INDUSTRIAL APPLICABILITY

The present disclosure is useful for applying EL display devices as an information display apparatus.

The invention claimed is:

1. An information display apparatus including a display panel comprising a display area where pixels of EL elements are arranged in matrix, a source signal line supplying an image signal to a pixel, and a gate signal line supplying a signal controlling selection or non-selection of luminescence of the pixel, wherein:
   the display panel has a polarizing plate for polarizing an incident light,
   the display panel comprises a coordinate detection mark having a characteristics of changing the direction of incident light, and
   the coordinate detection mark is formed in an area of the pixel where a light emitted from an EL element passes through, and overlaps an EL layer of the EL element in plan view.

2. The apparatus of claim 1, further comprising an electronic pen detecting the coordinate detection mark of the display panel,
   wherein the electronic pen has an optical generating means emitting a light for detecting the coordinate detection mark, and an image acquisition means capturing an image of predetermined range including the coordinate detection mark.

3. The apparatus of claim 1, wherein a fiber plate is disposed between the polarizing plate and the coordinate detection mark in the display panel.

4. The apparatus of claim 1, wherein:
   the display panel comprises plural coordinate detection marks, and
   a coordinate position in the display panel is indicated by the number of the coordinate detection marks, an interval between the coordinate detection marks, or positions of the coordinate detection marks.

5. The apparatus of claim 1, wherein:
   the pixels of the EL elements in the display panel include a red pixel, a green pixel, and a blue pixel, and
   the coordinate detection mark is formed on one of the red pixel and the blue pixel, and not on the green pixel, or the coordinate detection mark is formed on the blue pixel, and not on the red pixel and the green pixel.

6. The apparatus of claim 1, wherein:
   the display panel further includes a position adjustment mark having characteristics of changing a direction of incident light, and
   a shape and a position of the position adjustment mark are different from a shape and a position of the coordinate detection mark, respectively.

* * * * *